United States Patent
Mauder et al.

(10) Patent No.: US 11,728,420 B2
(45) Date of Patent: Aug. 15, 2023

(54) MESA CONTACT FOR A POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventors: Anton Mauder, Kolbermoor (DE); Hans-Juergen Thees, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 204 days.

(21) Appl. No.: 17/374,323

(22) Filed: Jul. 13, 2021

(65) Prior Publication Data

US 2022/0020876 A1    Jan. 20, 2022

(30) Foreign Application Priority Data

Jul. 15, 2020    (DE) .................... 102020118657.6

(51) Int. Cl.
| | |
|---|---|
| *H01L 29/78* | (2006.01) |
| *H01L 29/417* | (2006.01) |
| *H01L 29/66* | (2006.01) |
| *H01L 29/739* | (2006.01) |

(52) U.S. Cl.
CPC .... *H01L 29/7804* (2013.01); *H01L 29/41741* (2013.01); *H01L 29/66348* (2013.01); *H01L 29/66734* (2013.01); *H01L 29/7397* (2013.01); *H01L 29/7813* (2013.01)

(58) Field of Classification Search
CPC .......... H01L 29/7804; H01L 29/41741; H01L 29/66348; H01L 29/66734; H01L 29/7397; H01L 29/7813

USPC ......................................................... 257/288
See application file for complete search history.

(56) References Cited

U.S. PATENT DOCUMENTS

| | | | |
|---|---|---|---|
| 6,359,306 B1 | 3/2002 | Ninomiya | |
| 2010/0140657 A1 | 6/2010 | Takei | |
| 2014/0252460 A1* | 9/2014 | Lee | H01L 29/4236 |
| | | | 438/270 |
| 2020/0066870 A1* | 2/2020 | Thees | H01L 29/41766 |

(Continued)

FOREIGN PATENT DOCUMENTS

| | | |
|---|---|---|
| DE | 112018006007 T5 | 8/2020 |
| WO | 2019103135 A1 | 5/2019 |

*Primary Examiner* — Igwe U Anya
(74) *Attorney, Agent, or Firm* — Murphy, Bilak & Homiller, PLLC

(57) ABSTRACT

A power semiconductor device includes: a semiconductor body with a drift region; a plurality of trenches, wherein two adjacent trenches laterally confine a mesa of the semiconductor body. Each trench extends along a vertical direction and includes a trench electrode, and has a trench width along a first lateral direction and a trench length along a second lateral direction perpendicular to the first lateral direction, the trench length amounting to at least five times the trench width. The device further includes: a semiconductor body region of a second conductivity type in the mesa; a source region in the mesa; an insulation layer above and/or on the source region; a contact plug that extends at least from an upper surface of the insulation layer along the vertical direction so as to contact both the source region and the semiconductor body region.

24 Claims, 16 Drawing Sheets

(56) References Cited

U.S. PATENT DOCUMENTS

2020/0144370 A1\* 5/2020 Grasse ................ H01L 29/7811
2020/0176580 A1\* 6/2020 Siemieniec ......... H01L 29/1095

\* cited by examiner

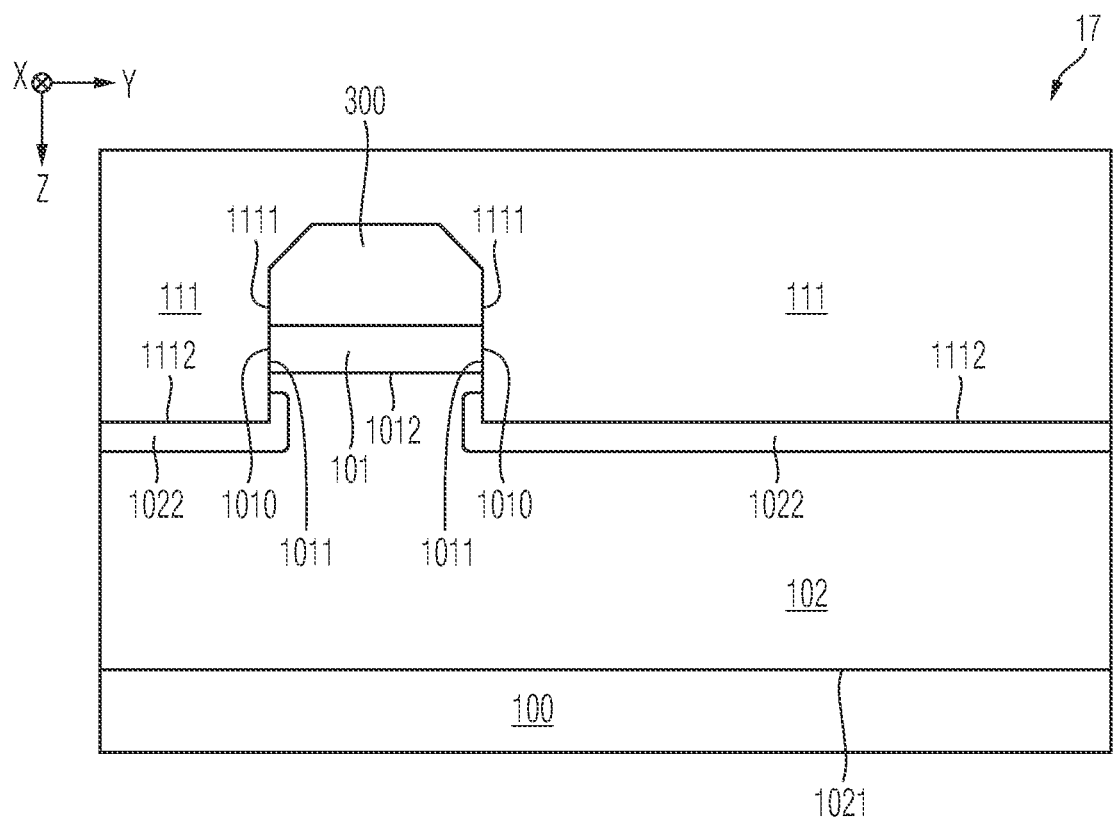

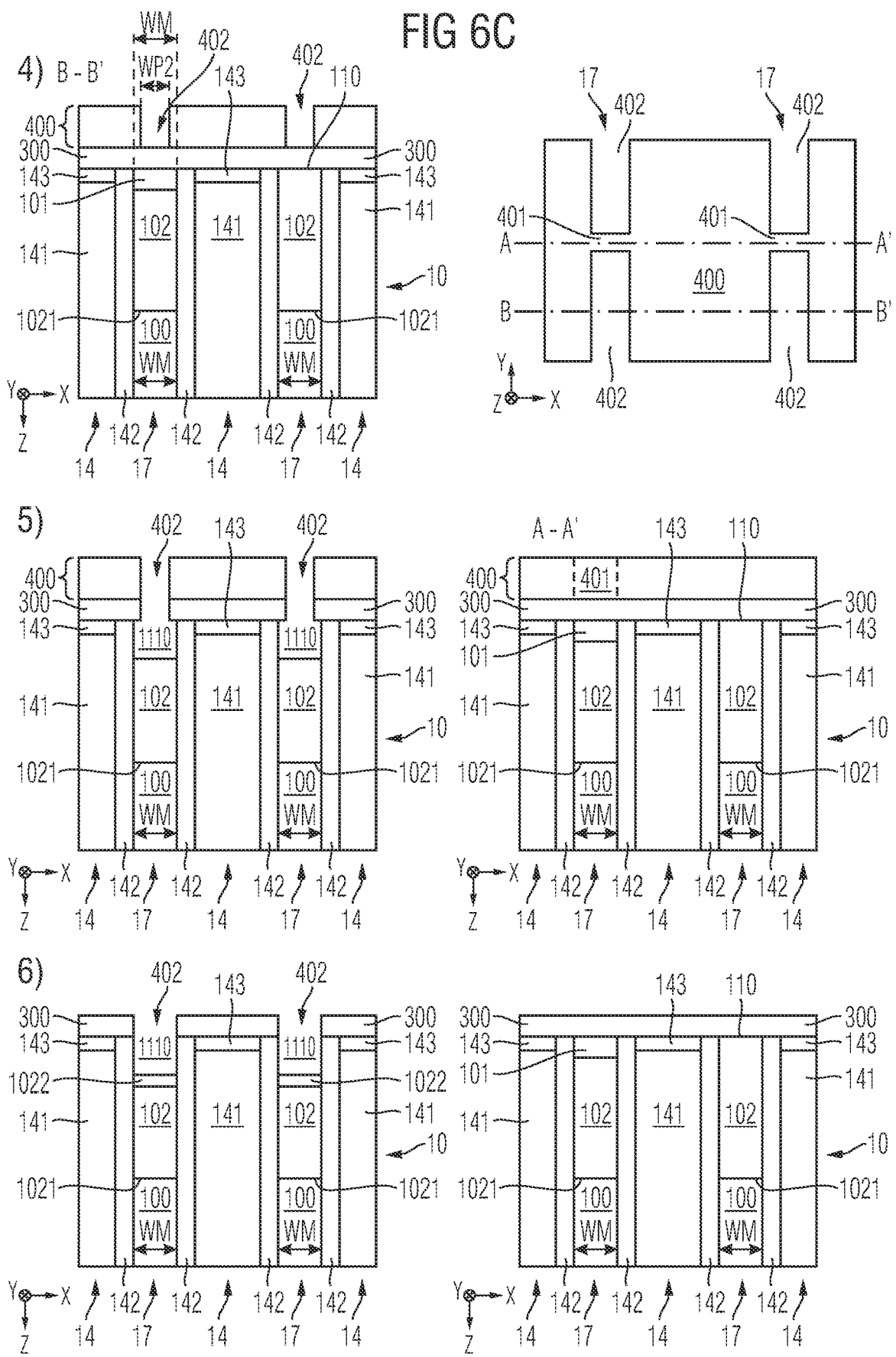

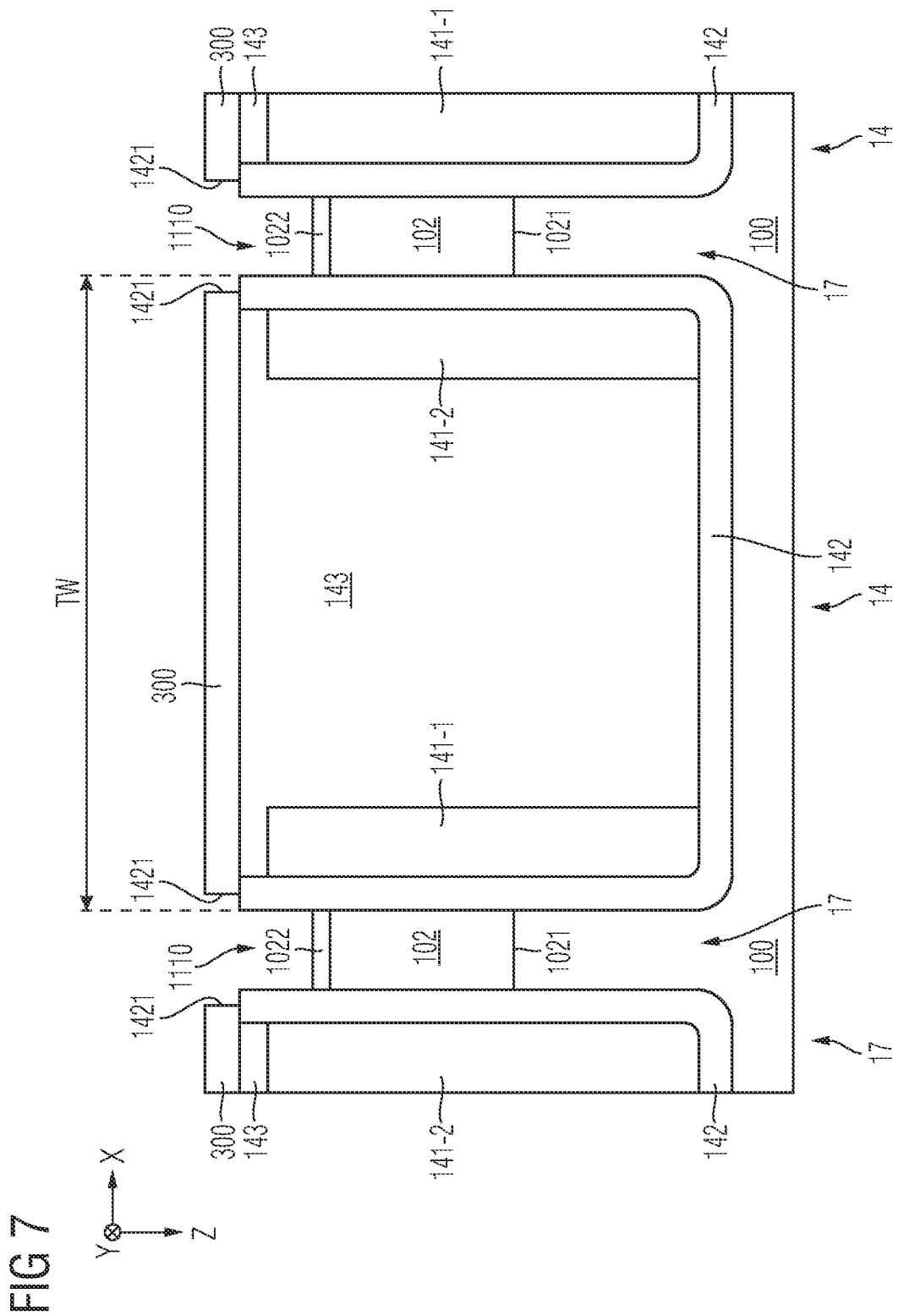

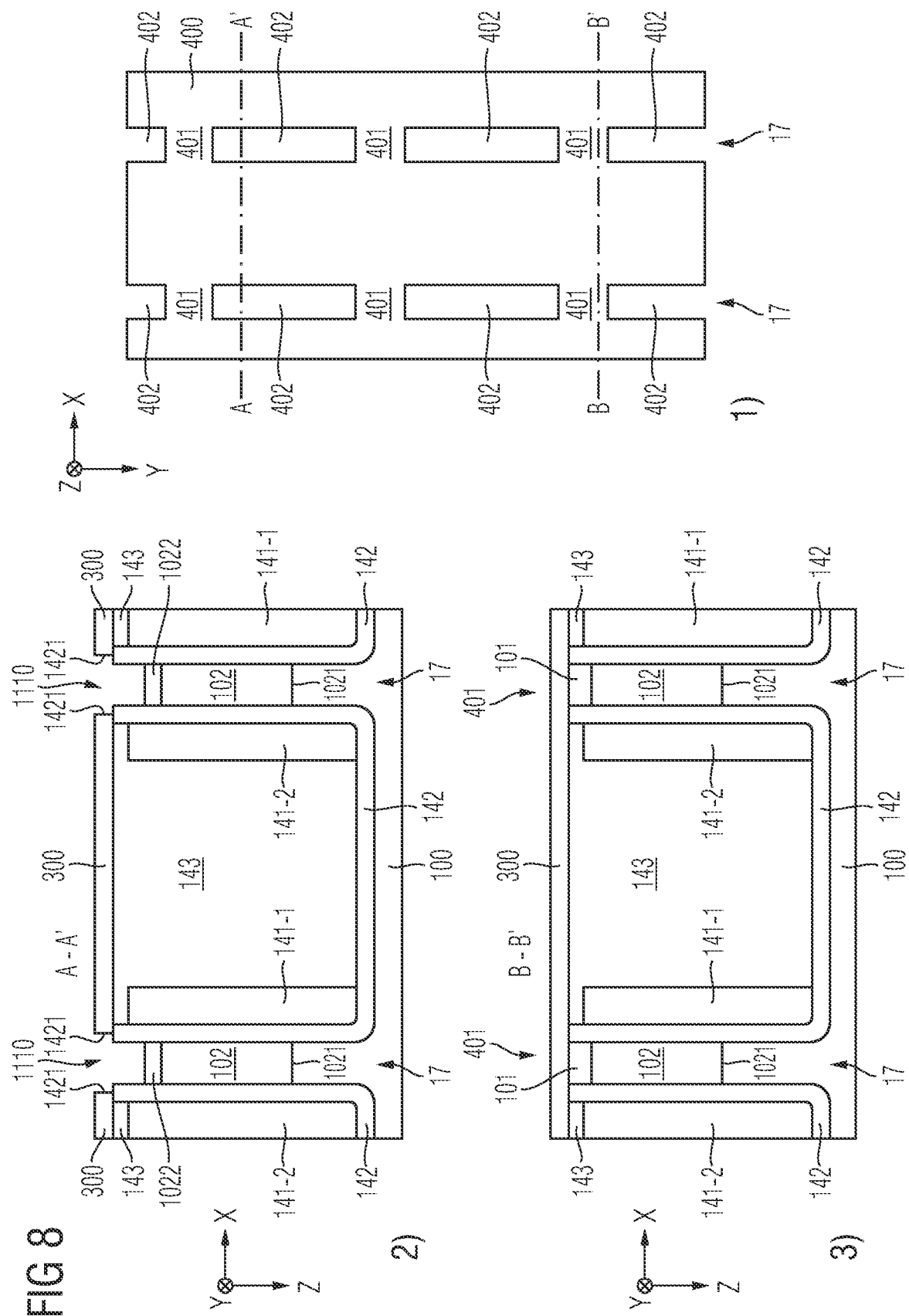

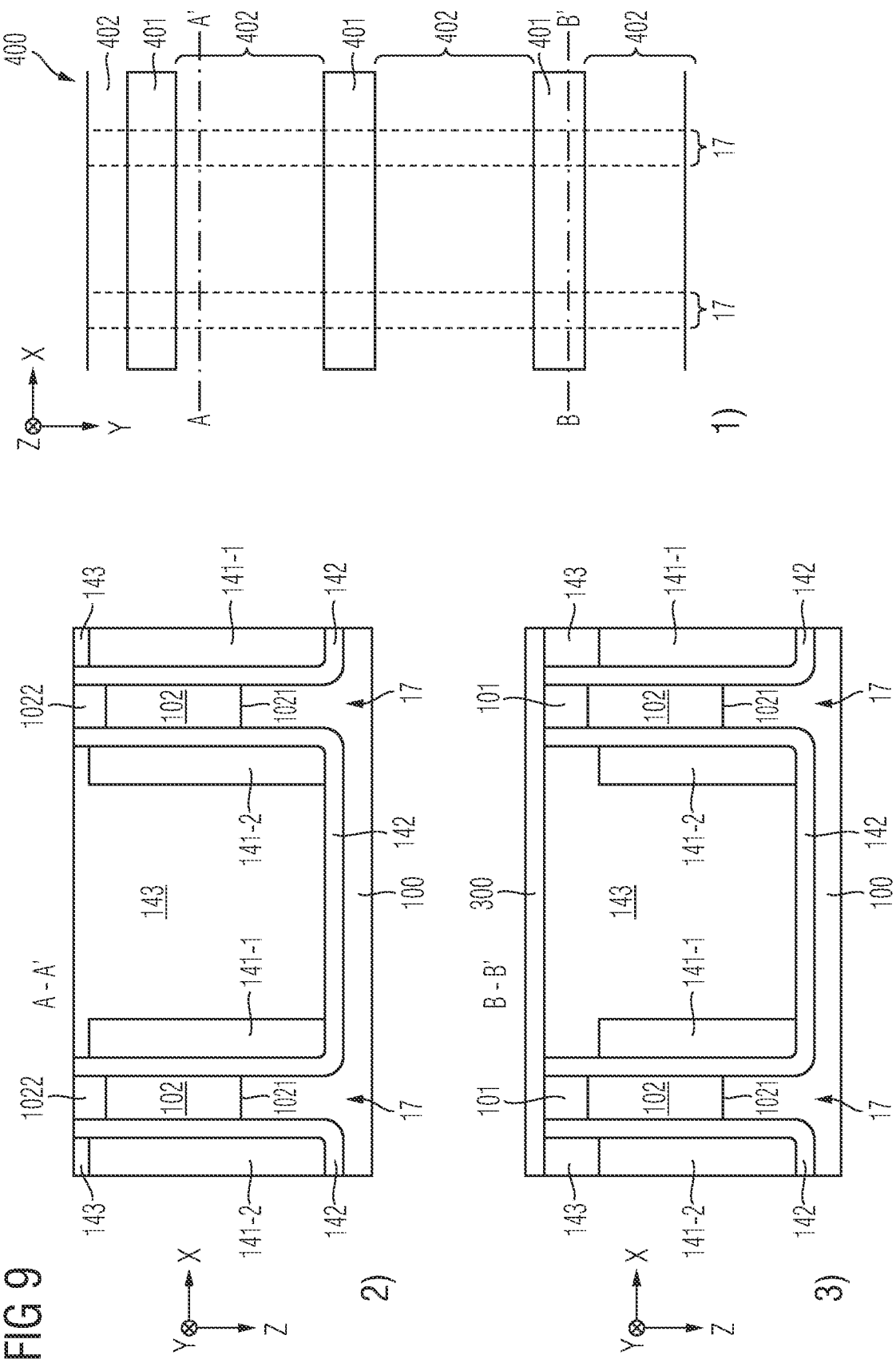

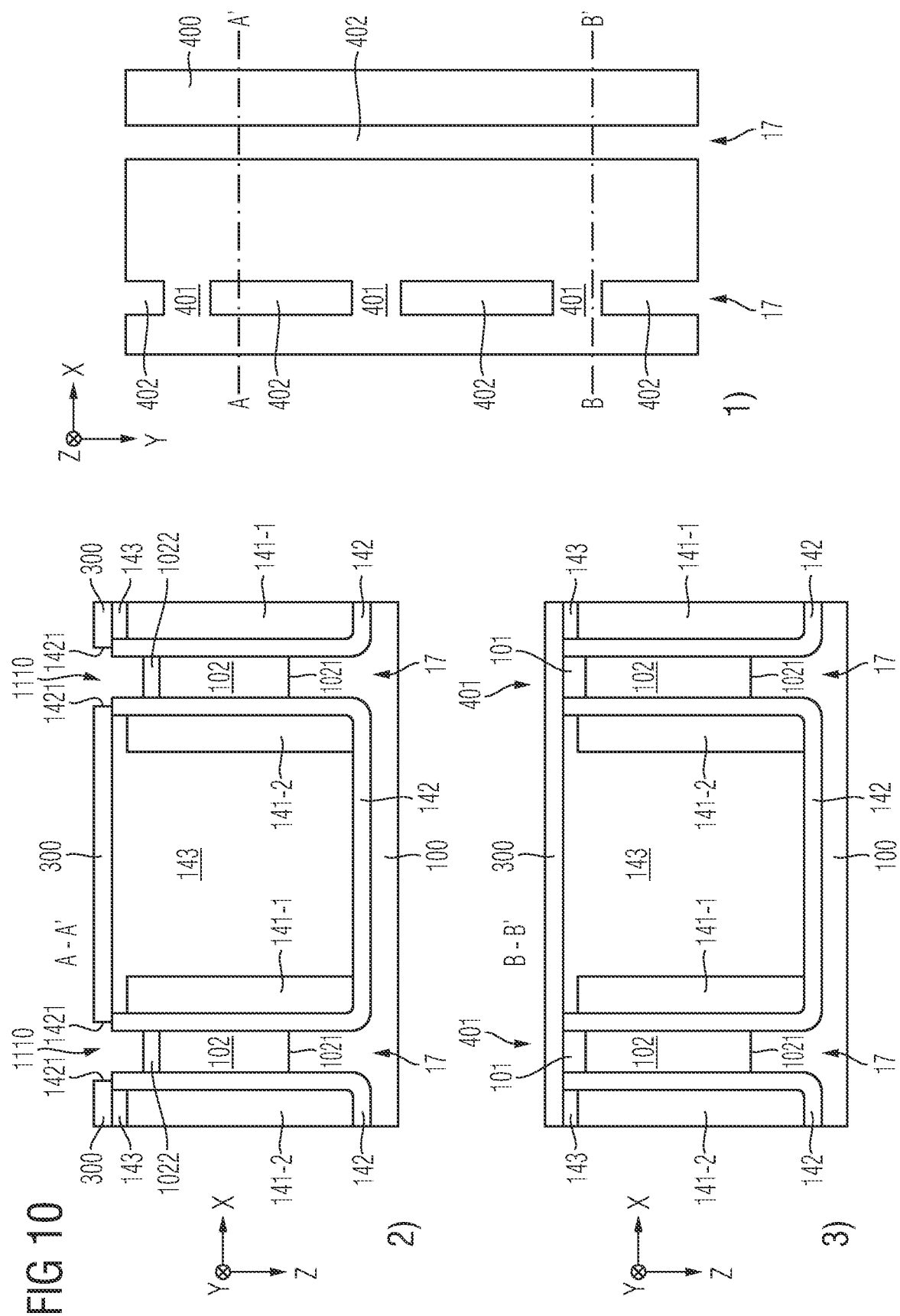

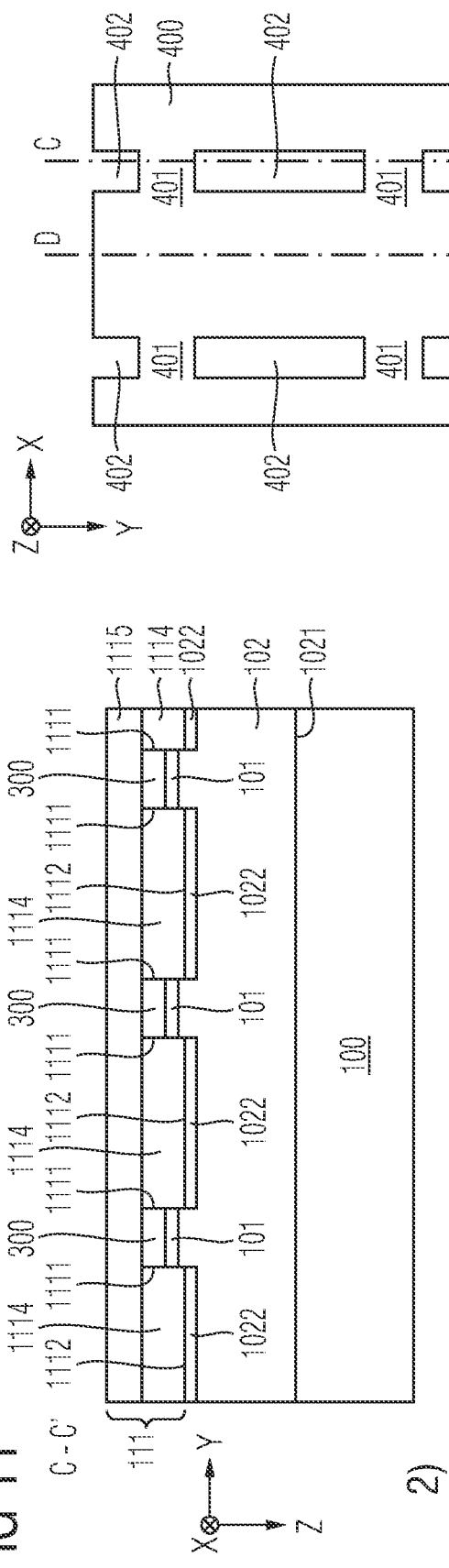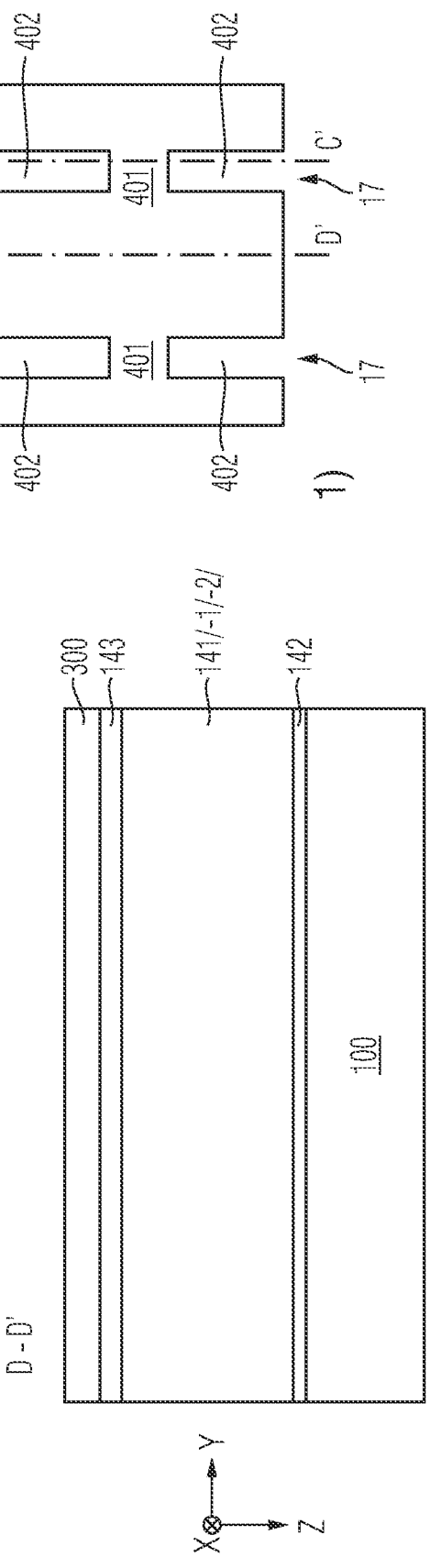

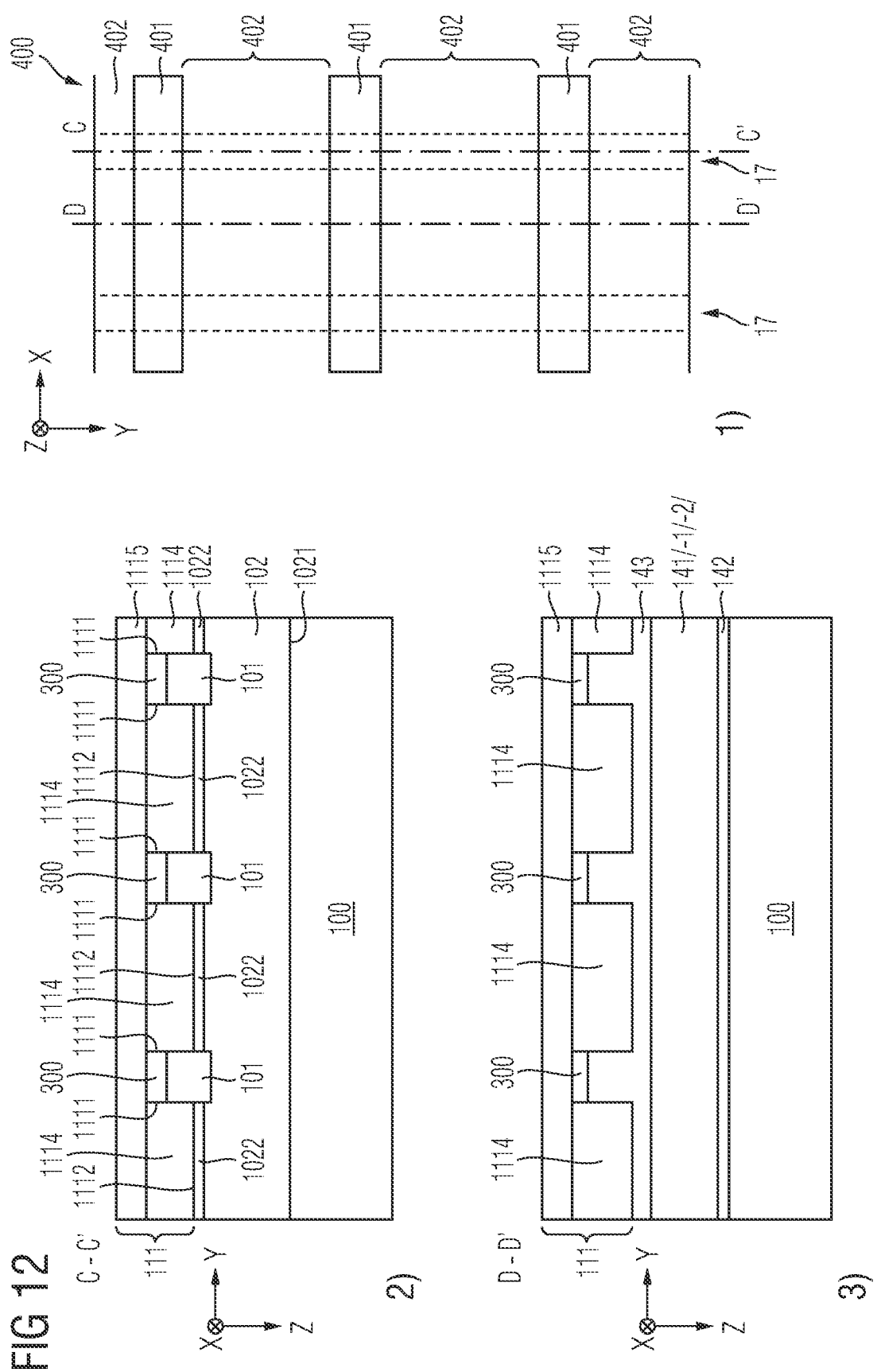

FIG 13A
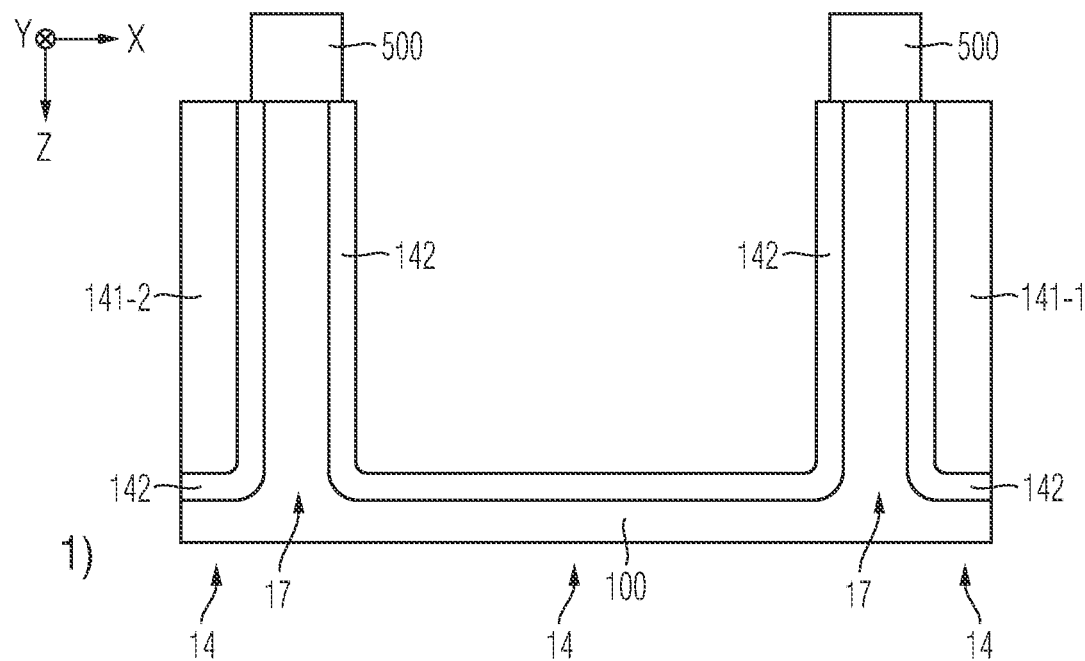
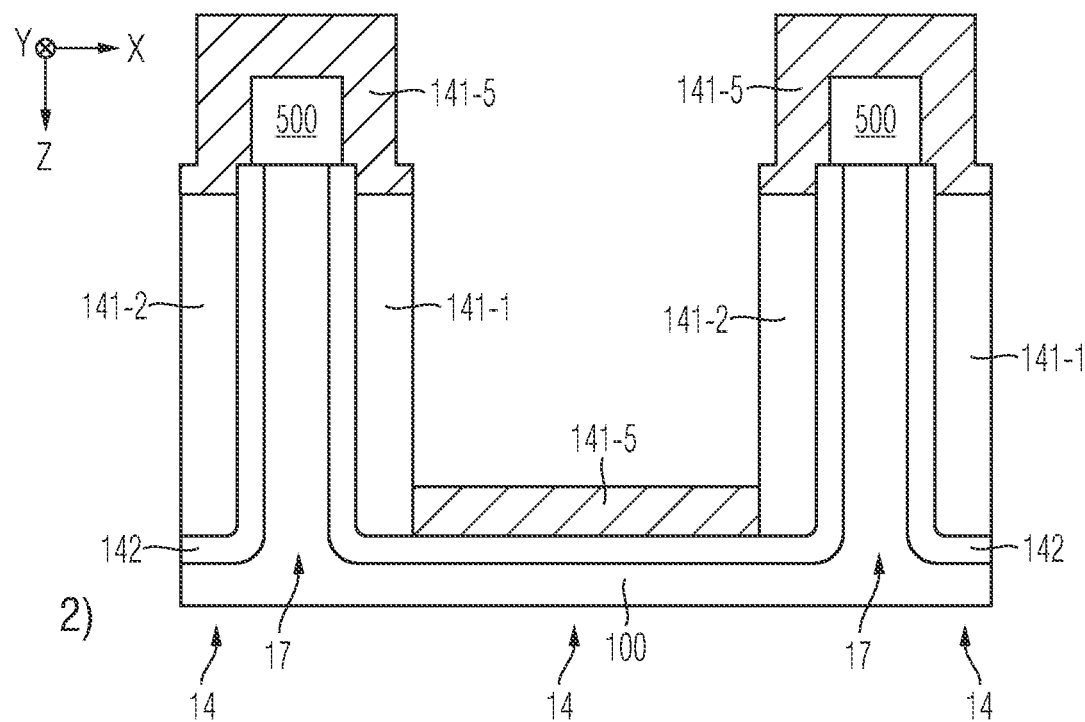

FIG 13B
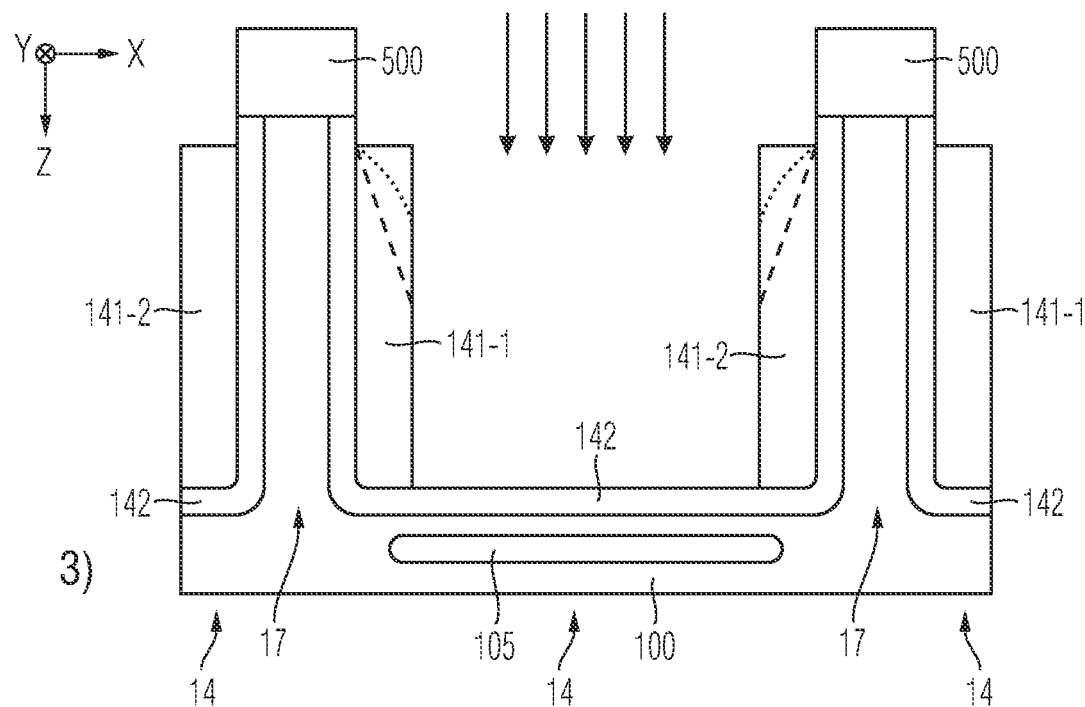
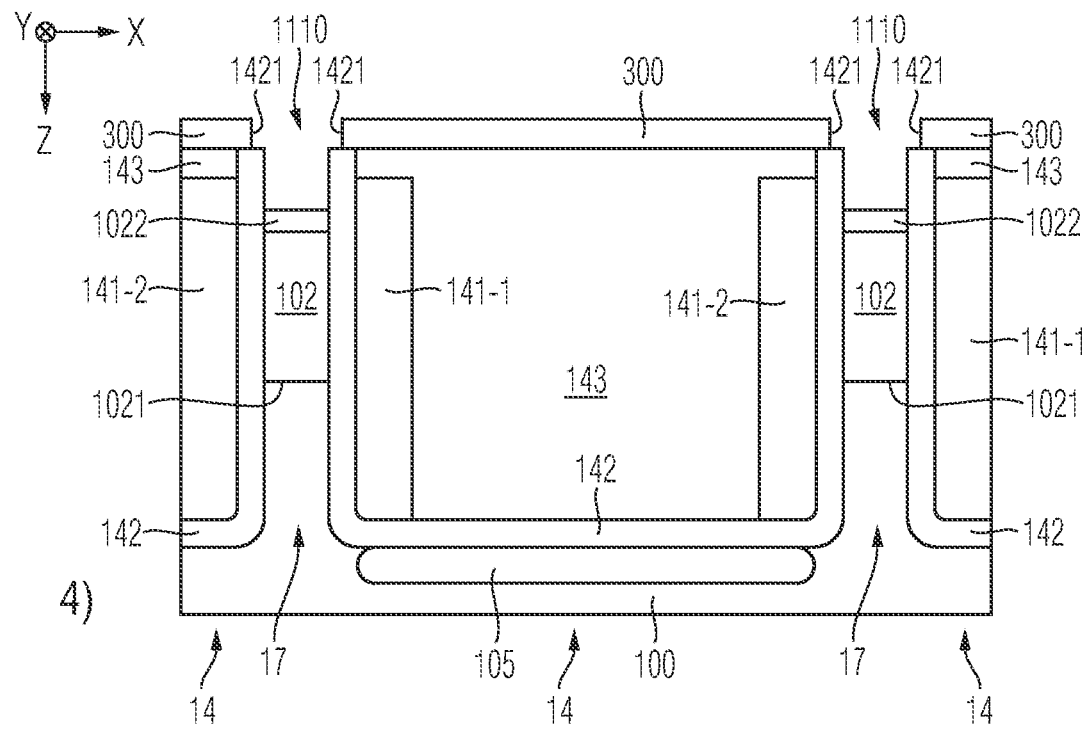

MESA CONTACT FOR A POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device. In particular, this specification is related to embodiments where a contact plug contacts a narrow mesa of the power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

Often, the gate electrode may be included within a trench of the power semiconductor switch, wherein the trench may exhibit a stripe configuration.

Two adjacent trenches laterally confine a portion of the semiconductor body typically referred to as mesa. Such mesa is typically configured for providing a path of the forward load current, e.g., by including a source region and a body region.

In order to provide for a path of the forward load current, the mesa must be electrically contacted with one of the load terminals of the power semiconductor device. To this end, it is for example known to establish such contact by means of a contact plug structure, according to which an electrically conductive material extends into a groove-like recess in a central portion of the mesa so as to there contact both the source region and the body region.

For diverse reasons, it may be desirable to keep the width of such mesa, i.e., the distance between opposite trench sidewalls of the adjacent trenches laterally confining the mesa, small.

However, as the mesa width becomes smaller, it also becomes more difficult to reliably contact the same based on a contact plug structure.

SUMMARY

According to an embodiment, a power semiconductor device comprises: a semiconductor body with a drift region of a first conductivity type; a plurality of trenches, wherein two adjacent trenches laterally confine a mesa of the semiconductor body. Each trench extends from a semiconductor body surface into the semiconductor body along a vertical direction and comprises a trench electrode isolated from the semiconductor body by a trench insulator and has a trench width along a first lateral direction and a trench length along a second lateral direction perpendicular to the first lateral direction, the trench length amounting to at least five times the trench width. The device further comprises a semiconductor body region of a second conductivity type in the mesa; a source region of the first conductivity type in the mesa, the source region being arranged above the semiconductor body region; an insulation layer above and/or on the source region; a contact plug that extends at least from an upper surface of the insulation layer along the vertical direction so as to contact both the source region and the semiconductor body region, the contact plug having sidewall portions and a bottom portion both interfacing with the semiconductor body. The contact plug extends into the semiconductor body along an entire top width of the mesa in the first lateral direction. The source region is contacted by at least one of the sidewall portions of the contact plug.

According to another embodiment, a method of producing a power semiconductor device is presented. The device comprises, in a semiconductor body, a drift region of a first conductivity type; and a plurality of trenches, wherein two adjacent trenches laterally confine a mesa of the semiconductor body and wherein each trench: extends from a semiconductor body surface into the semiconductor body along a vertical direction and comprises a trench electrode isolated from the semiconductor body by a trench insulator; has a trench width along a first lateral direction and a trench length along a second lateral direction perpendicular to the first lateral direction, the trench length amounting to at least five times the trench width. The device further comprises a semiconductor body region of a second conductivity type in the mesa. The method comprises: forming a source region of the first conductivity type in the mesa, the source region being arranged above the semiconductor body region; forming an insulation layer above and/or on the source region; providing a mask, wherein the mask includes at least one mask bridge covering a first portion of the source region and at least one mask opening exposing second portions of the source region in the mesa and below the insulation layer, wherein the first portion of the source region separates two adjacent ones of second portions of the source region along the second lateral direction in the mesa; in a region exposed by the at least one mask opening, removing a portion of the insulation layer and the second portions of the source region such that the remaining first portion of the source region forms an elevated source bridge between the two adjacent trenches in the mesa; depositing an electrically conductive material for forming a contact plug that extends at least from an upper surface of the insulation layer along the vertical direction so as to contact the first portion of the source region at a sidewall portion thereof.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 5 schematically and exemplarily illustrates a section of a vertical cross-section of a power semiconductor device in accordance with one or more embodiments;

FIG. 6A-C schematically and exemplarily illustrate, based on corresponding schematically illustrated sections of some vertical cross-sections and a horizontal projection, steps of a method of producing a power semiconductor device in accordance with some embodiments;

FIG. 7 schematically and exemplarily illustrates a section of a vertical cross-section of a power semiconductor device in accordance with one or more embodiments;

FIGS. 8-12 each schematically and exemplarily illustrate, based on corresponding schematically illustrated sections of some vertical cross-sections and a horizontal projection, aspects of a power semiconductor device in accordance with some embodiments; and FIG. 13A-B both schematically and exemplarily illustrate, based on corresponding schematically illustrated sections of some vertical cross-sections, steps of a method of producing a power semiconductor device in accordance with some embodiments.

DETAILED DESCRIPTION

Figure 1:
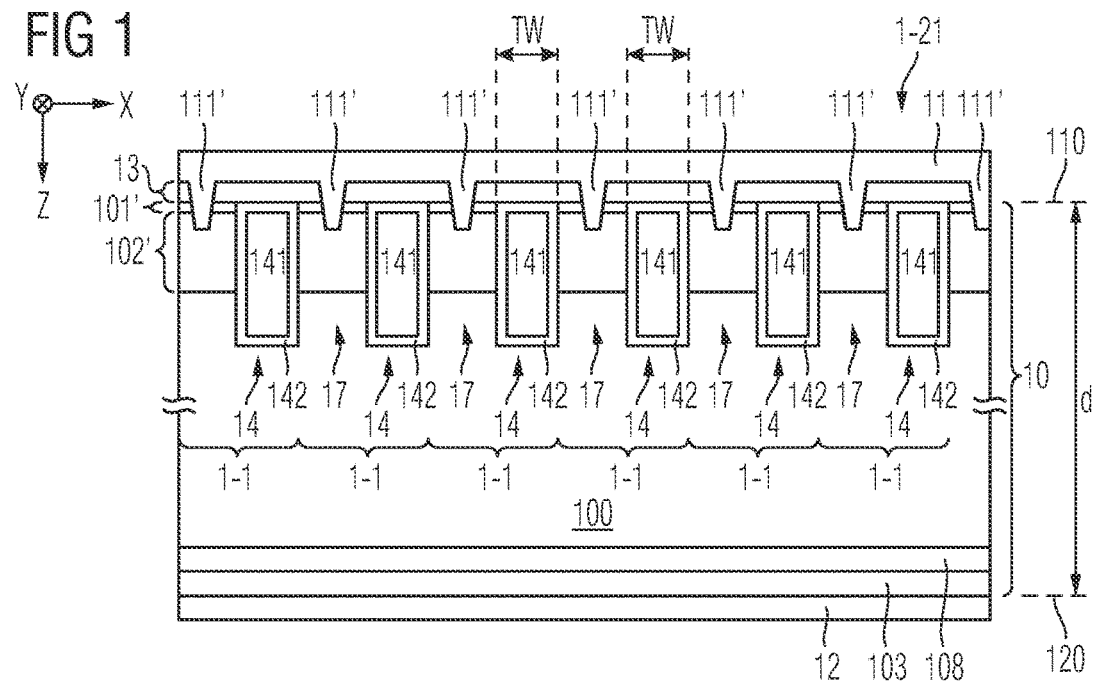
FIG. 1 schematically and exemplarily illustrates a section of a vertical cross-section of a power semiconductor device.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a stripe cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described below may be a single semiconductor chip exhibiting a stripe cell configuration (instead of a cellular/needle cell configuration) and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor based data processing.

The present specification in particular relates to power semiconductor devices embodied as respective IGBTs, i.e., bipolar power semiconductor transistors that are controlled by insulated electrodes (gates).

FIG. 1 schematically and exemplarily illustrates a section of a vertical cross-section of a power semiconductor device 1. The power semiconductor device 1 can be based on/implemented within a single-chip.

Figure 2A:
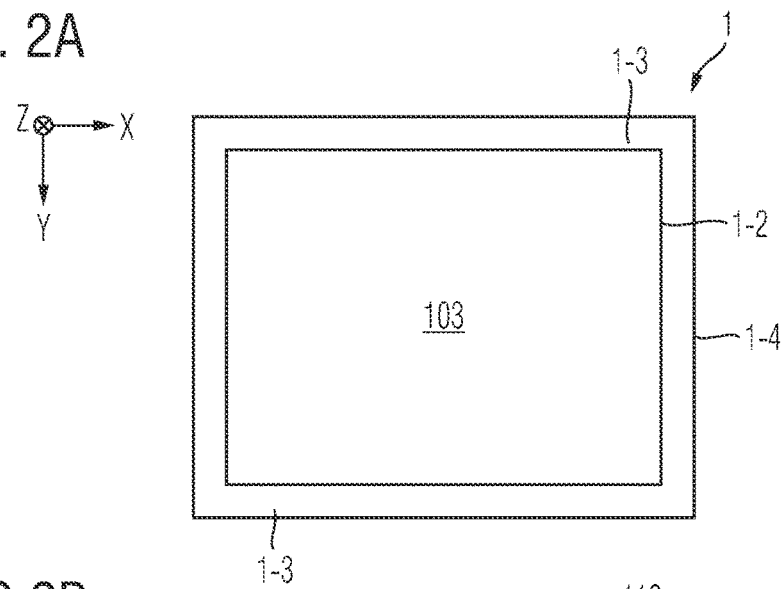
FIG. 2A-B both schematically and exemplarily illustrate a section of a horizontal projection of a power semiconductor device in accordance with one or more embodiments.
Figure 2B:
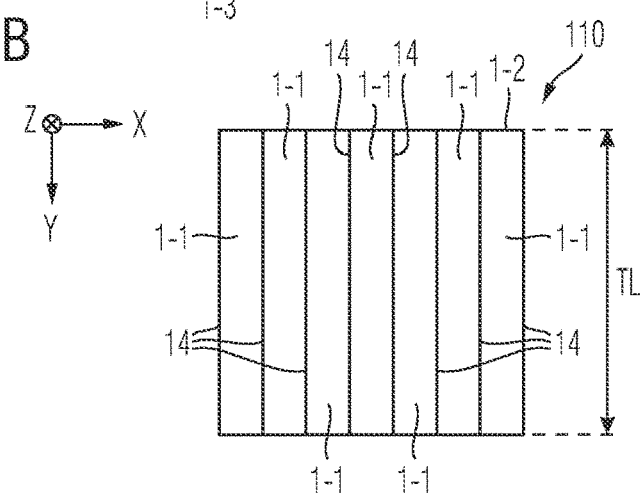

Referring to FIG. 2A, the power semiconductor device 1 has an active region 1-2 with a number of power cells 1-1, which are arranged in accordance with a stripe cell configuration as exemplarily illustrated in FIG. 2B. Accordingly, an extension in the second lateral direction Y of each power cell 1-1 amounts to a multiple of the extension in the first lateral direction X.

An edge termination region 1-3 of the power semiconductor device 1 surrounds the active region 1-2. Hence, the edge termination region 1-3 can be arranged external of the active region 1-2. The edge termination region 1-3 is laterally terminated by an edge 1-4. The edge 1-4 may form the chip edge of the power semiconductor device 1.

As used herein, the terms "edge termination region" and "active region" are both associated with the respective technical meaning the skilled person typically associates therewith in the context of power semiconductor devices. That is, the active region 1-2 is primarily configured for load current conduction and (if applicable) switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

Referring to FIG. 1 again, the power semiconductor device 1 has a semiconductor body 10 having a frontside 110 and a backside 120. The frontside 110 (herein also referred to as semiconductor body surface) and the backside 120 may vertically terminate the semiconductor body 10. That is, the semiconductor body 10 has a total thickness d along the vertical direction Z between the frontside 110 and the backside 120. In the lateral directions, the semiconductor body 10 may be terminated by the edge 1-4 (not illustrated in FIG. 1). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the frontside 110 and the backside 120 along the vertical direction Z in the active region 1-2, e.g., measured at a center of the active region 1-2.

The semiconductor body 10 forms a part of both the active region 1-2 and the edge termination region 1-3. E.g., the below described possible configurations of the power cell(s) 1-1 is primarily implemented in the semiconductor body 10. The semiconductor body 10 is, in the active region 1-2 configured to conduct a forward load current between a first load terminal 11 and a second load terminal 12.

A first load terminal 11 is arranged at the semiconductor body frontside 110 and a second load terminal 12 is arranged at the semiconductor body backside 120. E.g., the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may interface with the frontside metallization. At the backside 120, the semiconductor body 10 may interface with the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. E.g., as exemplary illustrated in FIG. 1, said local contacts can be established by means of a contact plug 111' penetrating an insulation structure 13, e.g., according to which an electrically conductive material extends into a groove-like recess in a central portion of a mesa so as to there contact both a source region 101' and a body region 102'.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed lateral-homogenously at the semiconductor body backside 120, e.g., so as to establish a laterally homogenous contact with the semiconductor body 10 at the backside 120. Such homogenous structure may also be implemented in regions where the second load terminal 12 laterally overlaps with the edge termination region 1-3.

For example, the lateral boundary of the active region 1-2 is defined by the lateral boundary of the outermost power cell(s) 1-1. Hence, the lateral boundary of the active region 1-2 may be defined at the frontside 110. This lateral boundary can be defined by an outermost source region(s) 101' (cf. explanation in more detail below). For example, all functional elements to enable conduction of the load current are present in a vertical projection of the active region 1-2 of the power semiconductor device 1, e.g., including at least the first load terminal 11 (e.g., a frontside metal contact thereof, e.g., one or more of the contact plugs 111'), the source region(s) 101', a body region 102', a drift region 100, a backside emitter 103, and the second load terminal 12 (e.g., a backside metal thereof).

In an embodiment, the edge termination region 1-3 and the active region 1-2 may be symmetrically arranged to one another, e.g., with respect to a central vertical axis of the power semiconductor device 1, as it is exemplarily illustrated in FIG. 2A.

Furthermore, the lateral transition between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be observed at the backside 120.

Returning to FIG. 1, an exemplary configuration of one of the power cells 1-1 shall be described. Each power cell 1-1 of the power semiconductor device 1 may be equally configured. For example, each power cell 1-1 includes at least one trench 14 and at least one mesa 17. In other embodiments, each power cell 1-1 may include more than one trench 14 and more than one mesa 17, wherein the trenches 14 may be identically or differently configured, and wherein the mesa 17 may be identically or differently configured.

A body region 102' of the second conductivity type is included in the semiconductor body 10. The body region 102' may be arranged in electrical contact with the first load terminal 11, e.g., by means of the contact plug 111'. In some power cells 1-1, there is furthermore provided at least one source region 101' of the first conductivity type arranged in electrical contact with the first load terminal 11, e.g., also by means of the contact plug 111'. In contrast to the schematic illustration in FIG. 1, it is also possible that the source region 101' is arranged only at one side of the contact plug 111' in the respective mesa 17.

A major part of the semiconductor body 10 is formed as a drift region 100 of the first conductivity type, which interfaces with the body region 102' and forms a pn-junction therewith.

The body region 102' separates the source regions 101' from the drift region 100.

Each power cell 1-1 is furthermore associated with a trench electrode 141. The trench electrodes 141 may be arranged in a respective trench 14 and can be isolated from the semiconductor body 10 by means of a respective trench insulator 142. Upon receipt of a corresponding control signal, e.g., provided by a non-illustrated gate driver unit, each trench electrode 141 can induce a conductive channel in a section of the body region 102' adjacent to the respective trench electrode 141. Thus, some power cells 1-1 are configured for controlling at least a portion of the load current between the first load terminal 11 and the second load terminal 12.

The above-described basic configuration of the power cells 1-1 of a power semiconductor device (e.g., an IGBT or RC-IGBT) is as such known to the skilled person, and the present specification employs the term "power cells" within the scope of the technical meaning the skilled person typically associates therewith.

Furthermore, in addition to the configuration as control electrodes, other trench electrodes 141 could be provided in some or each of the power cells 1-1 that fulfill another function, such as dummy trench electrodes, source trench electrodes, floating trench electrodes and the like.

As illustrated in FIG. 1, the body region 102' extends from the frontside 110 along the vertical direction Z until it interfaces with the drift region 100. The drift region 100, which may laterally overlap with the entire lateral area occupied by the number of power cells 1-1, extends for a longer range along the vertical direction Z, until it interfaces with a field stop layer 108, wherein the field stop layer 108 is also of the first conductivity type, but exhibits a higher dopant dose as compared to the drift region 100. The field stop layer 108 is typically of significantly smaller thickness than the drift region 100. It also extends along the vertical direction Z until interfacing with the backside emitter 103. The backside emitter region 103 is arranged in electrical contact with the second load terminal 12, as illustrated in FIG. 1.

In case of an IGBT, the backside emitter region 103 acts as an emitter of the second conductivity type. Furthermore, if the power semiconductor device 1 is implemented as an RC—IGBT, the backside emitter region 103 may comprise some sections of the first conductivity type, which exhibit a rather high dopant concentration, typically in the range of $10^{16}$ cm$^{-3}$ to $10^{20}$ cm$^{-3}$.

With respect to the lateral extension of the backside emitter 103, in an embodiment, the emitter region 103 may laterally overlap with at least 80%, or at least 90% of a lateral area occupied by the number of power cells 1-1 in the active region 1-2. In an embodiment, the emitter region 103 may, as the drift region 100, laterally overlap with the entire (100% of the) lateral area occupied by the number of power cells 1-1 in the active region 1-2. In other embodiments, as illustrated in FIG. 2A, the emitter region 103 laterally overlaps with less than 100% of the lateral area occupied by the number of power cells 1-1 in the active region 1-2, e.g., with around 80% to 90%.

It is emphasized that the power semiconductor device 1 may also be embodied as a MOSFET, with corresponding implications regarding the configuration of the semiconductor regions 103 and 108, or as a device deviated from a MOSFET configuration or an IGBT configuration.

The above-described aspects of the power semiconductor device 1 are known to the skilled person. The embodiments described herein do not deviate from these generally known aspects, but are related to a novel design regarding the contact between the first load terminal 11 and the mesas, as well as the mesa configuration in terms of the source region 101' and the body region 102'. As in particular these aspects are modified in accordance with the embodiments disclosed herein, in the subsequent description, the body region will be referred to with reference numeral 102, the source region with reference numeral 101 and the contact plug with reference numeral 111, whereas the other reference numerals introduced above do not designate components that necessarily differ from those introduced with respect to FIGS. 1-2B and are accordingly used in the same manner below.

For diverse reasons, it may be desirable to keep the width of the mesa, i.e., the distance between opposite trench sidewalls of the adjacent trenches 14 laterally confining the mesa, small. However, as the mesa width becomes smaller, it also becomes more difficult to reliably contact the same based on a contact plug 111' in a manner as illustrated in FIG. 1.

Figure 3A:
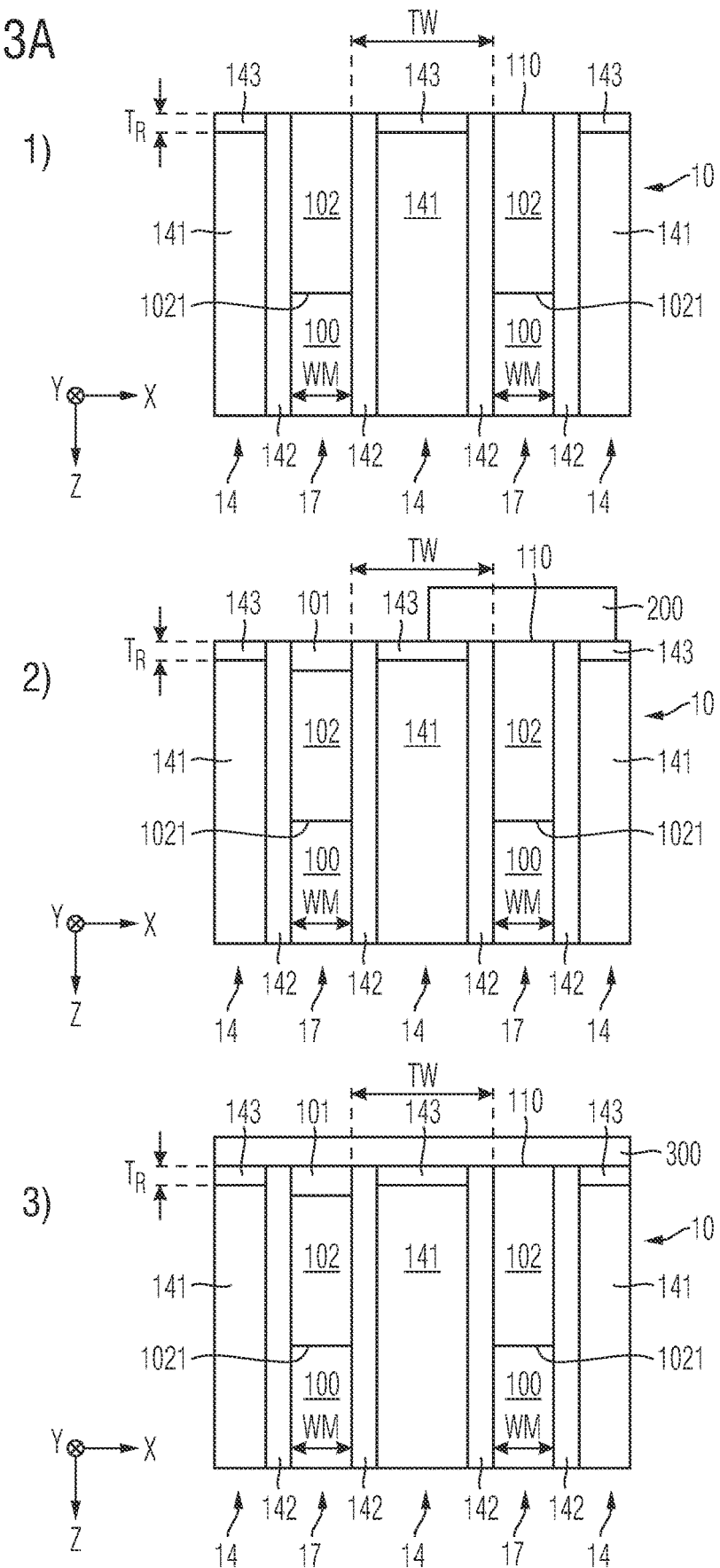
FIG. 3A-B both schematically and exemplarily illustrate, based on corresponding schematically illustrated sections of some vertical cross-sections and a horizontal projection, steps of a method of producing a power semiconductor device in accordance with one or more embodiments.
Figure 3B:
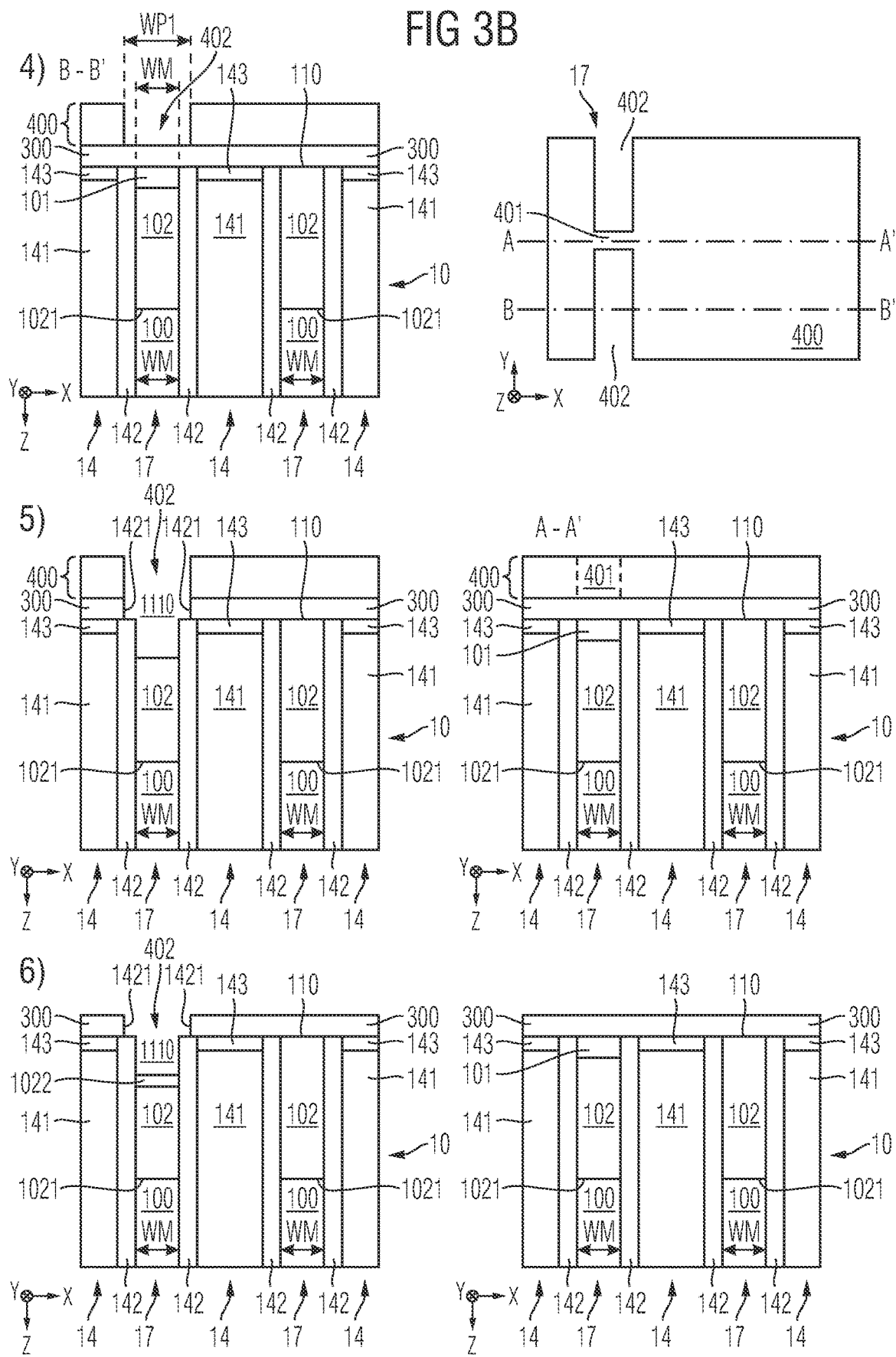

FIGS. 3A-B both schematically and exemplarily illustrate, based on corresponding schematically illustrated sections of some vertical cross-sections and a horizontal projection, steps of a method of producing a power semiconductor device in accordance with one or more embodiments. In the following, reference will be made to FIGS. 3 A-B and to FIG. 4.

The illustrated method may be briefly described as follows, wherein aspects thereof will be described in more detail further below:

The illustrated method is a method of producing a power semiconductor device 1. The provided (cf. FIG. 3A, step 1)) power semiconductor device 1 comprises: in a semiconductor body 10, a drift region 100 of the first conductivity type; a plurality of trenches 14, wherein two adjacent trenches 14 laterally confine a mesa 17 of the semiconductor body 10 and wherein each trench 14 extends from a semiconductor body surface 110 into the semiconductor body 10 along the vertical direction Z and comprises a trench electrode 141 isolated from the semiconductor body 10 by a trench insulator 142; has a trench width TW along a first lateral direction X and a trench length TL (cf. FIG. 2B) along the second lateral direction Y perpendicular to the first lateral direction X, the trench length amounting to at least five times the trench width TW; a semiconductor body region 102 of a second conductivity type in the mesa 17. Regarding these features of the power semiconductor device 1, it is referred to the description above with respect to FIGS. 1-2B.

Figure 4:
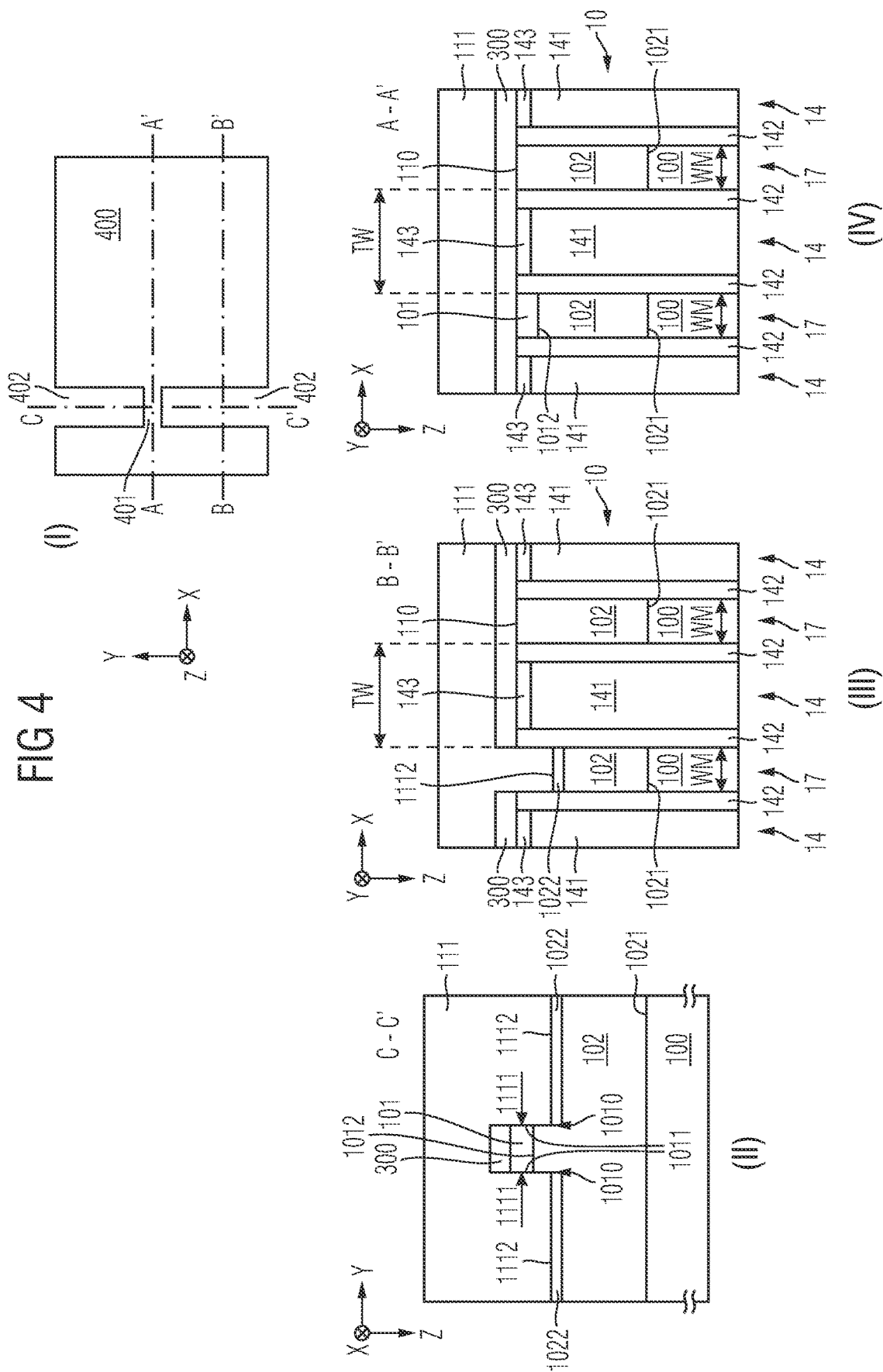
FIG. 4 schematically and exemplarily illustrates, based on corresponding schematically illustrated sections of some vertical cross-sections and a horizontal projection, aspects of a power semiconductor device in accordance with one or more embodiments.

The illustrated method comprises: forming (cf. FIG. 3A, step 2)) a source region 101 of the first conductivity type (e.g., a semiconductor source region 101) in the mesa 17, the source region 101 being arranged above the semiconductor body region 102 in the mesa 17; forming (cf. FIG. 3A, step 3)) an insulation layer 300 above and/or on the source region 101; providing (cf. step 4)) a mask 400, wherein the mask 400 includes at least one mask bridge 401 covering a first portion of the source region 101 and at least one mask opening 402 exposing second portions of the source region 101 in the mesa 17 and below the insulation layer 300, wherein the first portion of the source region 101 separates two adjacent ones of second portions of the source region 101 along the second lateral direction Y in the mesa 17; in a region exposed by the at least one mask opening 402, removing (cf. FIG. 3B, step 5)) a portion of the insulation layer 300 and the second portions of the source region 101 such that the remaining first portion of the source region 101 forms an elevated source bridge between the two adjacent trenches 14 in the mesa 17; and depositing (cf. FIG. 4, (III)) an electrically conductive material for forming a contact plug 111 that extends at least from an upper surface of the insulation layer 300 along the vertical direction Z so as to contact the first portion of the source region 101 at a sidewall portion 1011 thereof.

With regards to step 1), the power semiconductor device 1 to be produced may be provided in a conventional configuration where the plurality of trenches 14 laterally confine the plurality of mesas 17. Again, it is emphasized that the trenches exhibit a stripe configuration (i.e., TW<<TL) and that the, during the course of producing the device 1, the trench electrodes 141 may be connected to different electrical potentials. I.e., not every trench electrode 141 must be connected to a control/gate terminal of the device, but could also be connected to the first load terminal 11 (typically a source terminal) or be electrically floating or connected to the control/gate terminal via specific ohmic resistances or other coupling impedance, depending on the desired configuration of the power cells 1-1. The same analogously applies to the configuration of the mesas 17: The mesas 17 may each be identically configured or vary in configuration from each other. E.g., a first configuration of the mesa 17 may be the configuration as described with respect to the left one of the two mesas illustrated in FIGS. 3A-B, a second configuration of the mesa 17 may be the configuration as illustrated for the right one of the two mesas of FIGS. 3A-B, according to which the mesa 17 is not electrically contacted by a contact plug, but isolated from the first load terminal 11 based on the insulation layer 300, e.g., so as to act as a "dummy mesa". In another variant, the mesa may be configured without the source region 101, but with the body region 102 and the body region 102 may be contacted with a contact plug 111, e.g., in a manner explained above with respect to the to the left one of the two mesas illustrated in FIGS. 3A-B, e.g., so as to act as a "diode mesa". Hence, power cells 1-1 of various configurations may be produced.

In an embodiment, the top width WM of the mesa 17 amounts to no more than 500 nm, to no more than 300 nm, or to no more than 100 nm. In an embodiment, the top width WM of the mesa 17 amounts to less than 50 nm. For example, the top width WM is measured at the vertical level where the source region 101 interfaces with the body region 102. Of course, depending on the design of the trenches 14, the mesa width may slightly vary along the vertical extension of the mesa 17. E.g., a bottom mesa width may be smaller or greater or equal to the mesa top width WM.

Furthermore, as will be explained in more detail below, each of the trenches 14 may exhibit more than one trench electrode 141. E.g., two trench electrodes 141-1/2 (cf. FIG. 7) may be provided and laterally displaced from each other. The two trench electrodes 141-1/2 could also be vertically displaced from each other.

In an embodiment, the trench electrode 141 of at least one of said two adjacent trenches 14 is separated, along the vertical direction Z, from the insulation layer 300 by an upper trench insulator 143. E.g., each trench electrode 141 is separated, along the vertical direction Z, from the insulation layer 300 by a respective upper trench insulator 143. The upper trench insulator 143 can have a vertical extension amounting up to 90% of a vertical extension of the source region 101. In other words, the tops of the trench electrodes 141 may be vertically retracted from the semiconductor body surface 110 by a certain distance $T_R$, e.g., such that the source region 101 is elevated with respect to the tops of the trench electrodes 141.

The pn-junction 1021 is formed within the mesa 17 by a transition between the body region 102 and the drift region 100 along the vertical direction Z. The pn-junction may extend along the entire mesa width.

Illustrated method step 2) relates to forming the source region 101 in the mesa 17. E.g., to this end, a source mask 200 may be employed covering those portions of the semiconductor body surface 110 under which the source region 101 shall not be formed. E.g., in the illustrated example, the right mesa 17 shall not be equipped with the source region 101, but shall act as dummy mesa (as illustrated) or as diode mesa. In an embodiment, the source mask 200 exposes the left mesa 17 along its entire mesa width such that the provided source region 101 extends along the entire top width WM of the mesa 17 in the first lateral direction X. In other words, the source mask 200 may be structured accordingly, e.g., based on a structure length greater than the mesa top width WM ore even greater than the trench width TW. Hence, regarding the lithography related to forming the source region 101, the method does not require high complexity.

Forming the source region 101 may include one or more implantation processing steps.

The formed source region 101 may be arranged at the top of the mesa 17; e.g., the semiconductor body surface 110 may be partially formed by the source region 101 in the mesa 17.

After forming the source region 101, the source mask 200 is removed and, as illustrated for step 3) in FIG. 3A, the insulation layer 300 is formed above, for example on the source region 101. That is, the source region 101 in the mesa 17 may partially form the semiconductor body surface 110 and the formed insulation layer 300 may be arranged in contact with the source region 101. For example, the insulation layer 300 is formed on the entire wafer surface and may therefore be in contact with each of the upper trench insulator(s) 143, the trench insulator(s) 142 and the source region(s) 101.

Forming the insulation layer 300 may include one or more deposition processing steps. E.g., the insulation layer 300 may hence include one or more sublayers. Furthermore, the insulation layer 300 may be densified, e.g., based on a tempering processing step. Regarding the material of the insulation layer 300, the insulation layer 300 may for example include one or more of TEOS, PSG, BSG and BPSG.

For example, the formed insulation layer 300 extends along the entire top width WM of the mesa 17 between the two adjacent trenches 14.

Here, it shall be noted that the insulation layer 300 may formed on a surface formed by the upper trench insulator 143, the trench insulator 142 and the semiconductor body surface (e.g., formed by the source region 101 and optionally by the body region 102), wherein said surface may be a plane, e.g., a horizontal plane in parallel to the first and second lateral directions X and Y. The insulation layer 300 may be homogenously formed on such surface such that it exhibits a substantially constant thickness, e.g., in the range of 50 nm to 2000 nm, or in the range of 100 nm to 500 nm along the vertical direction Z.

Step 4) illustrated in FIG. 3B relates to forming the contact plug 111 that shall eventually contact the mesa 17. To this end, the mask 400 is provided which is illustrated both in vertical cross section (left side, cut along B-B') and a horizontal cross-section (right side). In an embodiment, the first portion of the source region 101 (that is covered by the mask bridge 401, cf. step 5), right side, cut along A-A') and the second portions of the source region 101 (exposed by the mask openings 402) laterally overlap with each other along the first lateral direction X and do not laterally overlap with each other along the second lateral direction Y in the mesa 17. Here, it shall be understood that the "exposed" second portions of the source region 101 are still covered by the insulation layer 300.

In an embodiment, the mask openings 402 expose almost the entire mesa 17, namely, in the example according to FIG. 3B, along the entire mesa top width WM and along almost the entire mesa length in the second lateral direction Y (cf. length TL in FIG. 2B), expect for the region covered by the mask bridge 401. For example, the at least one mask opening 402 exposes the mesa 17 below the insulation layer 300 entirely along the first lateral direction X and at least 40% or at least 60% of the mesa 17 along the second lateral direction Y. That is, in the example illustrated in FIG. 3B, the width WP1 of the mask opening 402 in the first lateral direction X may be greater as the mesa top width WM, e.g., by 25 nm, by 50 nm or by 80 nm in total, e.g., so as to compensate for overlay tolerances. Due to such "enlarged" width of the mask opening 402, after the subsequent removing steps, staircase like structures 1421 can be formed at the trench insulators 142.

Figure 6A:
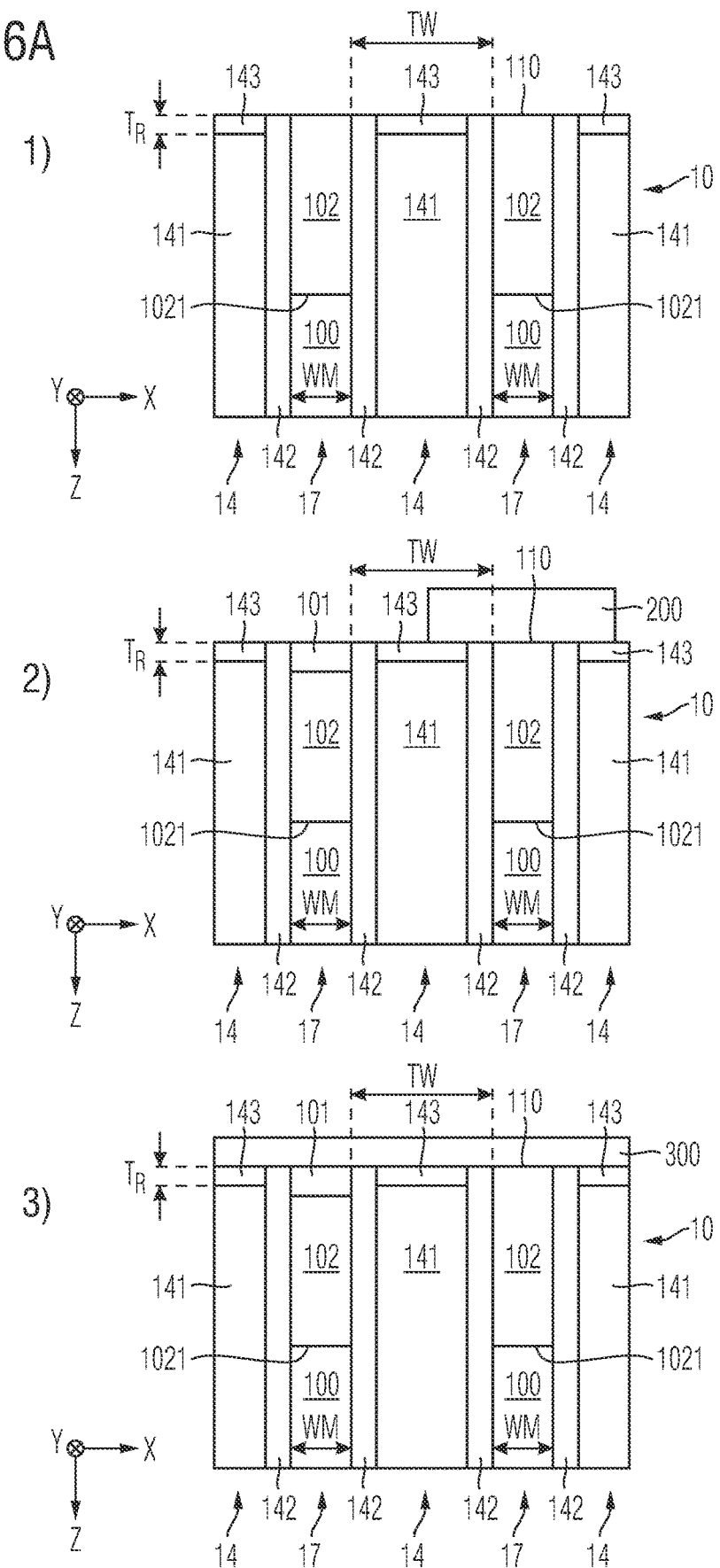
Figure 6B:
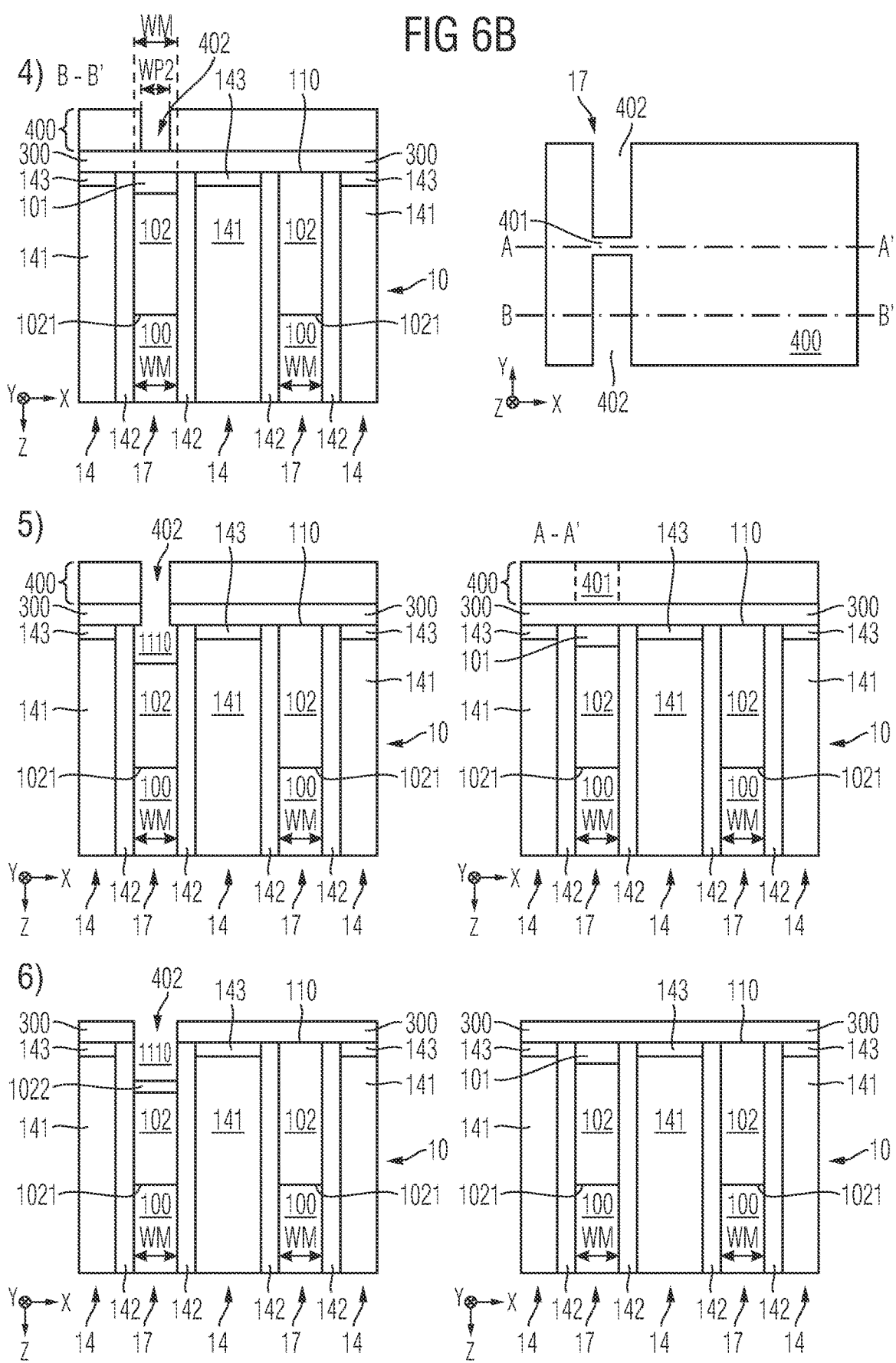

In another embodiment, as illustrated in FIG. 6B, the at least one mask opening 402 exposes the mesa 17 below the insulation layer 300 partially along the first lateral direction X and at least 40% or at least 60% of the mesa 17 along the second lateral direction Y. That is, in the example illustrated in FIG. 6B (cf. step 4), the width WP2 of the mask opening 402 in the first lateral direction X may be smaller as the mesa top width WM, e.g., by 25 nm, by 50 nm or by 80 nm in total, but, e.g., by no more than 200 nm in total.

In an embodiment, the mesa 17 is covered by at least one of such mask bridge 401. If more than one source region 101 shall be provided in the mesa 17, more mask bridges 401 may be provided that are displaced from each other along the second lateral direction Y. The size and/or the number of the mask bridges used to cover the mesa portions where the source region(s) shall remain depends on target parameters of the power semiconductor device 1, such as the desired latch-up robustness.

The design of the mask 400 hence determines both where the contact plug(s) is/are formed and, simultaneously, where the source region 101 is removed. Hence, in accordance with embodiments described herein, in terms of the first and second lateral directions X and Y, the source regions 101 and the contact plugs 111 used for contacting the source regions may be complementarily positioned.

Now it is referred to method step 5) in FIG. 3B, illustrating, in the left part, the removing of the portion of the insulation layer 300 and the second portions of the source region 101 such that the remaining first portion of the source region 101 forms, as illustrated in the right section, the elevated source bridge between the two adjacent trenches 14 in the mesa 17. Accordingly, with the removing step, also parts of the body region 102 below said second portions of the source region 101 may be removed. The remaining first portion of the source region 101 forms, as best illustrated in the right section of step 5) in FIG. 3B and in section (II) of FIG. 4, the elevated source bridge having sidewall portions 1011 and a bottom portion 1012 forming a pn-junction with the body region 102.

The removing step may include at least one etch processing step. E.g., a first etch processing step is related to etching the exposed sections of the insulation layer 300, and a second etch processing step is a selective etch processing step related to the semiconductor material in the mesa 17. The selective etch processing may be anisotropic, isotropic or a combination of both types.

The removing step yields a contact groove 1110, into which the contact plug 111 may extend. A lateral width of the contact groove 1110 may be self-aligned based on the mesa top width.

After forming the contact groove 1110, the mask 400 may be removed. However, in an embodiment, the insulation layer 300 remains.

An optional further step 6) includes forming, after said removing, in the remaining semiconductor body region 102, a semiconductor body contact region 1022 of a higher dopant concentration, e.g., by means of applying an implantation processing step. During such step, the remaining first portion of the source region 101 that forms the elevated source bridge is covered by the insulation layer 300 and will hence not be subjected to such implantation processing step.

In an embodiment, each the formed contact grooves 1110 has a length in the second lateral direction Y of more than twice the mesa width WM. Additionally, said length in the second lateral direction Y may be smaller than ten times the mesa width WM.

After these steps, annealing processing steps may be carried out and the contact groove 1110 may be filled with the electrically conductive material so as to form the contact plug 111, cf. FIG. 4, to which it will now be referred:

Part (I) of FIG. 4 illustrates the mask 400 (as in step 4) of FIG. 3B/FIG. 6B) with the mask bridge 401 and the mask openings 402, and parts (II) to (IV) vertical cross-sections along lines A-A', B-B' and C-C', respectively, shown in section (I). As the mask 400 is removed, parts (II) to (IV) do not show the mask 400.

Part (II) of FIG. 4 shows a section of the mesa 17 and the formed contact plug 111 along a plane in parallel to the second lateral direction Y and the vertical direction Z. Accordingly, the contact between the contact plug 111 and the first portion of the source region 101 is established at interface areas 1010 at which the first portion of the source region 101 interfaced with the second portions of the source region 101 before the second portions of the source region 101 have been removed. The contact plug 111 extends at least from an upper surface of the insulation layer 300 along the vertical direction Z. For example, the upper surface of the insulation layer 300 interfaces with the contact plug 111, e.g., such that the contact plug 111 extends from above the insulation layer 300 along the vertical direction Z, and a lower surface of the insulation layer 300 interfaces with the source region 101.

Sidewall portions 1111 of the contact plug 111 and sidewall portions 1011 of the first portion of the source region 101, i.e., of the elevated source bridge, contact each other at said interface areas 1010.

The interface areas 1010, i.e., both the sidewall portions 1111 of the contact plug 111 and the sidewall portions 1011 of the elevated source bridge 101 may be tilted with respect to the second lateral direction Y, e.g., arranged perpendicular thereto.

Referring to parts (II) and (III) of FIG. 4, the semiconductor body region 102 may be contacted by a bottom portion 1112 of the contact plug 111. For example, said bottom portion 1112 contacts the semiconductor body contact region 1022 of higher dopant concentration previously formed. A bottom portion 1012 of the elevated source bridge 101 is contact with the portion of the semiconductor body region 102 below thereof, forming pn-junction.

Hence, in accordance with embodiments described herein and as illustrated in parts (II) and (IV) of FIG. 4, the elevated source bridge 101 is separated, along the vertical direction Z, from an upper part of the contact plug 111 by the insulation layer 300 while at the same part a lower part of the contact plug 111 forms said sidewall portions 111 that contact, below the insulation layer 300, the sidewall portions 1011 of the elevated source bridge 101.

The foregoing description, in particular with respect to FIGS. 3A-B, 4 and 5 correspondingly applies to each of the remaining FIGS. 6-14, if not explicitly stated otherwise.

FIG. 5 essentially corresponds to an enlarged version of FIG. 4, part (II). Due to the etch processing steps, the insulation layer 300 above the elevated source bridge 101 may exhibit a chamfer at its top side. Furthermore, due to the annealing processing steps that may be applied, the semiconductor body contact region 1022 of higher dopant concentration may slightly extend into the region corresponding to a vertical projection of the insulation layer 300. To what extend the elevated source bridge 101 is elevated with respect to bottom portions 1112 of the contact plug 111 that contact the semiconductor body contact region 1022 depends on the manner of carrying out said removing step, e.g., the duration of the relevant etch processing step (cf. steps 5) in FIGS. 3B, 6B and 6C, in other words, how deep the contact groove 1110 is formed. For example, it is avoided that the elevated source bridge 101 interfaces with the semiconductor body contact region 1022, but only with the semiconductor body region 102.

FIGS. 6A-C illustrate a variation of the method as illustrated in FIGS. 3A-B. Steps 1) to 3) correspond, however, exactly to steps 1) to 3) of FIG. 3A, such it is referred to the above. The variation relates to the mask 400 that is provided in step 4).

According to the embodiment in FIG. 6B, the at least one mask opening 402 exposes the mesa 17 below the insulation layer 300 partially along the first lateral direction X and at least 40% or at least 60% of the mesa 17 along the second lateral direction Y. That is, in the example illustrated in FIG. 6B (cf. step 4)), the width WP2 of the mask opening 402 in the first lateral direction X may be smaller as the mesa top width WM, e.g., by 25 nm, by 50 nm or by 80 nm in total, but, e.g., by no more than 200 nm in total. Based on such design, said staircase-like structures 1421 do not come into being.

According to the embodiment in FIG. 6C, the mask 400 includes additional mask openings 402 and an additional mask bridge 401 exposing/covering the right mesa 17 where no source region 101 has been formed (cf. step 2)). Accordingly, when said removing step is carried out (cf. step 5), contact grooves 1110 are also formed with respect to the right mesa 17, corresponding to the positions of the mask openings 402 above said mesa 17. Accordingly, the semiconductor body contact region 1022 is also formed in the right mesa 17 (cf. step 6), and when depositing the electrically conductive material, a contact plug is also formed for the right mesa 17, e.g., such that this mesa 17 may act as "diode mesa". In a vertical cross-section in parallel to the second lateral direction Y, this would yield a structure as illustrated in FIG. 4, part (II), and FIG. 5, with the difference that the elevated source bridge 101 is replaced with a corresponding portion of the semiconductor body region 102.

As best illustrated with respect to method step 4) in FIGS. 3B, 6B and 6C, the at least one mask bridge 401 and the at least one mask opening 402 may extend perpendicular to the trench length TL in the second lateral direction Y and, optionally, across several adjacent trenches 14 (cf. FIG. 6C) and hence across several adjacent mesas 17, wherein not every mesa has to be equipped with a source region 101, as just explained.

FIG. 7 schematically and exemplarily illustrates a section of a vertical cross section of a power semiconductor device 1 in accordance with one or more embodiments. There, the trenches 14 are formed as dual-electrode trenches 14, with a wider trench width TW and with first and second sidewall trench electrodes 141-1 and 141-2 in each trench 14. Still, the trenches 14 exhibit a stripe configuration with a trench length TL (cf. FIG. 2B) amounting at least five times the trench width TW. For example, as may be also fulfilled regarding the previously described embodiments, the trenches 14 continuously extend throughout the entire active region 1-2 (cf. FIG. 2A-B) along the second lateral direction Y. However, except for corresponding adaptions of dimension, the process for producing such power semiconductor device 1 (with wider/dual trench electrode) trenches may be carried out as explained above, e.g., with respect to FIGS. 3A-B and FIGS. 6A-B/C, method steps 1) to 6).

It is now referred to FIGS. 8-10, each schematically and exemplarily illustrating, based on corresponding schematically illustrated sections of two vertical cross-sections (parts (2) and (3)) and a horizontal projection (part (1)), aspects of such configured power semiconductor device 1 in accordance with some embodiments.

In accordance with the embodiment of FIG. 8, the adjacent mesas 17 are equally configured, i.e., both having elevated source bridges 101 in regions of the mesas 17 corresponding to vertical projections of the mask bridges 401. FIGS. 8 and 9 emphasize that the mask openings 402 may be small in lateral extension along the first lateral direction X so as to only expose the relevant sections of the mesas 17 (FIG. 8), or may be extended in lateral extension along the first lateral direction X so as to also expose parts of the trench 14 between the adjacent mesas (FIG. 9). For example, each of one or more of the mask openings 402 may hence expose sections of both of the adjacent mesas 17. As the insulation layer 300 below the mask openings 402 is removed, cf. FIG. 9, part (2), the electrically conductive material for forming the contact plugs 111 also extends above the upper trench insulator 143 between the trench sidewall electrodes 141-1/2.

In accordance with the embodiment of FIG. 10, the left one of the adjacent mesas 17 is processed as described before (e.g., with respect to FIGS. 3A-B and FIG. 8), and the right one of the adjacent mesas 17 is formed as diode mesa, i.e., without a source region 101. For example, it may be desired to contact the diode mesa along its entire extension in the second lateral direction Y, and, accordingly, the corresponding mask opening 402 exposes the entire right one of the adjacent mesas 17. A further non-illustrated mask may be used when carrying out method step 6) illustrated in FIGS. 3B, 6B and in particular in FIG. 6C, namely when forming the semiconductor body contact regions 1022. E.g., the semiconductor body contact region 1022 in the right one of the adjacent mesas 17 is structured along the second lateral direction Y based on such further mask, e.g., such that semiconductor body contact region 1022 is not formed where the right one of the adjacent mesas 17 overlaps, along the second lateral direction Y, with the elevated source region 101 in the left one of the adjacent mesas 17, and such that semiconductor body contact region 1022 is formed where the right one of the adjacent mesas 17 does not overlap, along the second lateral direction Y, with the elevated source region 101 in the left one of the adjacent mesas 17. Other ways of structuring the semiconductor body contact region 1022 in the right one of the adjacent mesas 17 are of course possible. Such structuring may yield an improved diode performance of the power semiconductor device 1.

At least one of the trench electrodes 141-2 and 141-1 adjacent to the right one of the adjacent mesas 17 may be connected to the control terminal of the power semiconductor device 1 or to a potential different therefrom, e.g., to the first load terminal 11. For example, both trench electrodes 141-2 and 141-1 adjacent to the left one of the adjacent mesas 17 may be connected to the control terminal. That is, each trench 14 may house at least two trench electrodes 141-1 and 141-2 that are connected to different electrical potentials.

It is now referred to FIG. 11, which schematically and exemplarily illustrates, based on corresponding schematically illustrated sections of two vertical cross-sections (parts (2) and (3)) and a horizontal projection (part (1)), aspects of the power semiconductor device 1 in accordance with an embodiment. In this embodiment, both of the adjacent mesas 17 are equally configured based on using the correspondingly structured mask 400. The mask bridges 401 cover portions of the insulation layer 300 beneath which the source regions 101 remain and form said elevated source bridges 101 (cf. part (2), cut along C-C'). The mask openings 402 expose other portions of the insulation layer 300 which are removed as well as the source region 101 below thereof. In the accordingly formed contact grooves 1110 (cf. FIGS. 3A-B and FIGS. 6A-C) the contact plugs 111 are formed, e.g., in a manner as has been described above.

Here, it is noted that the different materials may be used for forming the contact plugs 111. E.g., at an interface to the semiconductor material (e.g. formed by the semiconductor body contact region 1022), a metal silicide may be formed, e.g., comprising one or more of a titanium silicide, a cobalt silicide and a nickel silicide. Such metal silicide may be covered with aluminum copper, AlSiCu, copper or the like. Other materials such as titanium, titanium nitride and/or tungsten may be used, in particular in conjunction with a covering layer made of AlCu or Cu. For example, FIG. 11, part (2) illustrates an embodiment where the contact plugs 111 are formed based on a first material (composition) 1114 extending from the level of the surface of the insulation layer 300 into the contact grooves so as to contact both the respective elevated source bridge 101 with said contact plug sidewall portions 1111 and the semiconductor body contact region 1022 with said contact plug bottom portions 1112, and based on second material 1115 (e.g., AlCu or Cu) forming the covering layer above the insulation layer 300.

Part (3) of FIG. 11 illustrates a vertical cross-section along cut D-D', the insulation layer 300, the upper trench insulator 143, the trench electrode (which could be either a single trench electrode 141 of the trench 14, or one of multiple trench electrodes 141-1, 141-2), the trench insulator 142 at the bottom of the trench 14 and the drift region 100.

In accordance with the embodiment of FIG. 12, which also schematically and exemplarily illustrates, based on corresponding schematically illustrated sections of two vertical cross-sections (parts (2) and (3)) and a horizontal projection (part (1)), the mask 400 is differently configured, e.g., in a manner as has been described with respect to FIG. 9, i.e., where the mask 400 exhibits a stripe like configuration according to which the mask bridges 401 are formed by mask stripes extending continuously along the first lateral direction X and the mask openings 402 are formed by mask recesses also extending continuously along the first lateral direction X. Accordingly, such mask design does not alter the configuration of the mesas 17, cf. part (2) of FIG. 12 (being substantially identical to part (2) of FIG. 11), but as the enlarged mask openings also expose portions of the insulation layer 300 above the upper trench insulator 143, during the removing step (cf. step 5) in FIGS. 3B, 6B and 6C), also portions of the upper trench insulator 143 may be removed and the structure that comes into being when forming the contact plugs 111 extends also in regions above the trenches 14, cf. part (3) of FIG. 12.

In accordance with embodiments described herein, the design of the mask 400 determines the lateral positions and lateral dimensions of both the source regions 101 (i.e., the elevated source bridges 101) and the contact plugs 111. The design of the mask 400 formed based on the mask openings 402 and the mask bridges 401 may be chosen based on the following considerations: The mask bridges 401 may have an extension in the second lateral direction Y to limit the path length for holes e. g. during turn-off of an IGBT to reach an ohmic p-contact to the first load terminal 11 prior to reach a potential difference to the source region 101 that would cause injection of holes into the source region 101 and as a consequence the injection of electrons to the body region 102 which may lead to lose of control of the power semiconductor device 1 and as a consequence to its destruction. The mask opening(s) 402 may be configured in a way that the transconduction of the power semiconductor device 1, i.e., the change of load current depending on the gate potential, is in an appropriate region to fulfill the demands with respect to current slope during turn-on of the power semiconductor device 1 and current limitation in case of an overcurrent or failure event.

For example, as consistently illustrated in the drawings, each of the at least one mask bridges 401 bridges the entire mesa 17 (in which the one or more elevated source bridges are to be formed) along the first lateral direction X. Furthermore, each of the at least one mask bridges 401 may have a total extension in the second lateral direction Y of no more than 500 nm. This extension is hence also approximately the extension of the respective elevated source bridge 101 in the second lateral extension. For example, if the respective mesa 17 is bridged by more than one mask bridge 401, the distance between adjacent two of the mask bridges 401 in the second lateral direction Y may amount to at least 300 nm, or to at least 600 nm, or at least 1000 nm, wherein such distance is hence the distance of the respective mask opening 402 between adjacent two of the mask bridges 401 and approximately the extension of the contact plug 111 formed between adjacent two of the mask bridges 401.

Here, it shall be noted that the contact plug 111, in an embodiment, hence contacts with its sidewall portions 1112 two elevated source bridges 101 that are separated from each other along the second lateral direction Y, wherein the sidewall portions 1112 are tilted with respect to the second lateral direction Y, e.g. arranged substantially perpendicular to the second lateral direction Y, as exemplarily illustrated in parts (2) of FIGS. 11 and 12.

For example, the mask opening 402 and accordingly the formed contact plug 111 both have a total lateral extension in the second lateral direction Y amounting to at least twice of the top width WM of the mesa 17. That is: The mask opening 402 may have a total lateral extension in the second lateral direction Y at least twice as large as the total lateral extension of the adjacent mask bridge 401 in the second lateral direction Y.

FIGS. 13A-B both schematically and exemplarily illustrate, based on corresponding schematically illustrated sections of some vertical cross-sections, steps of a method of producing a power semiconductor device in accordance with some embodiments. Steps 1) to 3) illustrated therein may be carried out before step 1) of FIG. 3A or step 1) of FIG. 6A is carried out, and are related to forming the trench 14 with two (sidewall) trench electrodes 141-1, 141-2 and floating semiconductor barrier region 105 below the bottom of the trench 14. After steps 1) to 3) have been processed, the method of FIGS. 13A-B may be continued as described with respect to steps 1) to 6) of FIGS. 3A-B or FIGS. 6A-C, such that the device 1 is in a state as shown with respect to step 4) of FIG. 13B.

In step 1) of FIG. 13A, the device 1 is provided in a state according to which the trenches 14 have been etched and provided with the trench insulators 142, but not yet with the trench electrodes 141-1/2. The mesas 17 have also not been processed yet but are covered with a mesa mask 500.

Step 2) illustrates a deposition processing step in which an electrically conductive material is deposited for forming the trench electrodes 141-1/2 at the trench sidewalls. Due to the process, the electrically conductive material is also accumulated at the bottom of the trench 14 and around the mesa mask 500.

Such superfluous portions of the electrically conductive material is removed, e.g., by carrying out an etch processing step, e. g., an anisotropic etch processing step. The shape of trench electrodes 141-1/2 may be rectangular but also may be altered in various ways during attack of the etch process, wherein the dashed and dotted lines schematically illustrate two examples to explain possible alterations of the shape of the trench electrodes 141-1/2. The rectangular shape of the trench electrodes 141-1/2 is maintained in all other FIGS. 7 to 10 for simplicity.

Thereafter, in step 3), an implantation processing step or the like is carried out for forming the floating barrier region 105 below the bottom of the trench 14. Based on the implantation energy, dose, number of implantations, implantation angles (tilted, non-tilted) and implantation time, the position, extension and later dopant concentration of the floating barrier region 105 may be controlled. For example, the floating barrier region 105 may be vertically displaced from the trench insulator 142 at the bottom of the trench 14 or be arranged in contact thereto. The floating barrier region 105 may extend along the first lateral direction X so as to overlap with the trench electrodes 141-1/2 or even the opening of the mesas 17, or may be smaller in lateral width such that no such overlap with the mesa 17 is formed.

As indicated above, after the implantation in step 3), the device 1 may be processed in a manner as has been described above. E.g., the floating barrier region 105 is also subjected to said annealing processing steps (employed with respect to the elevated source bridges 101 and the semiconductor body contact regions 1022), e.g., in a manner yielding an extension of the floating barrier region 105 such that it is in contact with the trench insulator 142 at the bottom of the trench 14.

Presented herein is not only a method of producing a power semiconductor device, but also a power semiconductor device itself. The power semiconductor device comprises: a semiconductor body with a drift region of a first conductivity type; a plurality of trenches, wherein two adjacent trenches laterally confine a mesa of the semiconductor body. Each trench extends from a semiconductor body surface into the semiconductor body along a vertical direction and comprises a trench electrode isolated from the semiconductor body by a trench insulator and has a trench width along a first lateral direction and a trench length along a second lateral direction perpendicular to the first lateral direction, the trench length amounting to at least five times the trench width. The device further comprises a semiconductor body region of a second conductivity type in the mesa; a source region of the first conductivity type in the mesa, the source region being arranged above the semiconductor body region; an insulation layer above and/or on the source region; a contact plug that extends at least from an upper surface of the insulation layer along the vertical direction so as to contact both the source region and the semiconductor body region, the contact plug having sidewall portions and a bottom portion both interfacing with the semiconductor body. The contact plug extends into the semiconductor body along an entire top width of the mesa in the first lateral direction. The source region is contacted by at least one of the sidewall portions of the contact plug.

Embodiment of the power semiconductor device described in the preceding paragraph correspond to embodiments of the method described with respect to the drawings. In so far, it is referred to the above. Some embodiments of the power semiconductor device shall nonetheless be described in the following, using the reference numerals described above:

For example, the semiconductor body region 102 is contacted by the bottom portion 1112 of the contact plug 111, cf., e.g., FIG. 4, part (II).

In an embodiment, the bottom portion 1112 of the contact plug 111 is at least substantially arranged in parallel to both the first lateral direction X and the second lateral direction Y, and the sidewall portions 1111 of the contact plug 111 (that contact the source region 101, e.g., the elevated source bridge) are is at least substantially arranged in parallel to both the first lateral direction X and the vertical direction Y.

Furthermore, in an embodiment, the semiconductor body region 102 is additionally contacted by said at least one of the sidewall portions 1111 of the contact plug 111. For example, in how far such contact is established depends on the manner of carrying out the removal step (step 5) in FIGS. 3B, 6B and 6C), i.e., on how deep the contact groove 1110 extends into the mesa. For the reasons explained above, namely the shielding function of the semiconductor body contact region 1022 vertically displaced from the elevated source bridge 101, it may hence be appropriate to correspondingly design the depth of the contact groove 1110. Then, the semiconductor body region 102 is additionally contacted by said at least one of the sidewall portions 1111 of the contact plug 111, as for example illustrated in FIG. 4, part (II). The depth of the contact groove 1110, measured from a vertical level corresponding to the level of the semiconductor body surface 110, may for example amount to 280 nm, and the source region 101 may interface with the body region 102 at, e.g., 230 nm below said vertical level.

For example, in an embodiment, as consistently illustrated in the drawings, the bottom portion 1112 of the contact plug 111 is displaced from the source region 101 along the vertical direction Z, e.g., by at least 30 nm, or at least 50 nm. Also, the semiconductor body contact region 1022 may be displaced from the source region 101 along the vertical direction Z, e.g., by the same distance as just mentioned.

Furthermore, as consistently illustrated in the drawings, the source region 101 (that is: the elevated source bridge) may extend along the entire top width WM of the mesa 17 in the first lateral direction X. In the respect, it referred to the explanations with respect to method step 2) in FIGS. 3A and 6A. That is, the source region 101 may be arranged in contact with both trench insulators 142 of the two trenches 14 laterally confining the mesa 17. The sidewall portions 1011 of the source region 101 are, however, not those that interface with the trench insulators 142, but those arranged, for example, at least substantially perpendicular to the second lateral direction Y such that they may interface with the contact plug sidewall portions 1111, as described above.

Furthermore, as also consistently illustrated in the drawings, the contact plug 111 may be in contact with both trench insulators 142 of the adjacent trenches 14 laterally confining the mesa 17. For example, when forming the contact groove 1110 (cf. step 5) in FIGS. 3B, 6B and 6C), a portion of the mesa 17 is removed along the entire mesa top width WM. Hence, when depositing the electrically conductive material for forming the contact plug 111, the contact plug 111 is arranged in contact with both trench insulators 142 of the adjacent trenches 14 laterally confining the mesa 17. In accordance with known configurations as illustrated in FIG. 1 only central portions of the mesas are removed so that the contact plugs 111' are laterally displaced from the trench insulators 142; it is necessarily so because otherwise the contact plugs 111' could not simultaneously contact both the source region 101 and the body region 102.

Further embodiments of the method correspond to the embodiments of the power semiconductor device described above.

Furthermore, in addition to power cells including both a source region and a body region that are controlled by an adjacent gate electrode, other mesas of the power semiconductor device may contain diode or resistor structures instead, as for example the case for RC-IGBTs. For those skilled in the art it is apparent that the technical teaching disclosed herein can also be applied to contact such mesas of the power semiconductor device, as for example described above with respect to FIG. 6C, steps 4) to 6).

In the above, embodiments pertaining to power semiconductor devices, such as IGBTs, and corresponding processing methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xCl_{-x}$) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
a semiconductor body with a drift region of a first conductivity type;

a plurality of trenches, wherein two adjacent trenches laterally confine a mesa of the semiconductor body, wherein each trench extends from a semiconductor body surface into the semiconductor body along a vertical direction and comprises a trench electrode isolated from the semiconductor body by a trench insulator, wherein each trench has a trench width along a first lateral direction and a trench length along a second lateral direction perpendicular to the first lateral direction, the trench length amounting to at least five times the trench width;
a semiconductor body region of a second conductivity type in the mesa;
a semiconductor source region of the first conductivity type in the mesa, the source region being arranged above the semiconductor body region;
an insulation layer above and/or on the source region; and
a contact plug that extends at least from an upper surface of the insulation layer along the vertical direction so as to contact both the source region and the semiconductor body region, the contact plug having sidewall portions and a bottom portion both interfacing with the semiconductor body,
wherein the contact plug extends into the semiconductor body along an entire top width of the mesa in the first lateral direction,
wherein the source region is contacted by at least one of the sidewall portions of the contact plug.

2. The power semiconductor device of claim 1, wherein the semiconductor body region is contacted by the bottom portion of the contact plug.

3. The power semiconductor device of claim 2, wherein the semiconductor body region is additionally contacted by the at least one of the sidewall portions of the contact plug.

4. The power semiconductor device of claim 1, wherein the contact plug sidewall portions extend in parallel to the first lateral direction and/or wherein the contact plug bottom portion extends perpendicular to the vertical direction.

5. The power semiconductor device of claim 1, wherein the trench electrode of at least one of the two adjacent trenches is separated, along the vertical direction, from the insulation layer by an upper trench insulator.

6. The power semiconductor device of claim 5, wherein the upper trench insulator has a vertical extension amounting up to 90% of a vertical extension of the source region.

7. The power semiconductor device of claim 1, wherein the source region extends along an entire top width of the mesa in the first lateral direction.

8. The power semiconductor device of claim 1, wherein the contact between the contact plug and the source region is established at an interface area formed by the contact plug sidewall portion and a sidewall portion of the source region.

9. The power semiconductor device of claim 1, wherein the contact plug is in contact with both trench insulators of the adjacent trenches laterally confining the mesa.

10. The power semiconductor device of claim 1, wherein the bottom portion of the contact plug is displaced from the source region along the vertical direction by at least 30 nm.

11. The power semiconductor device of claim 1, wherein the contact plug contacts, with the sidewall portions, an additional source region in the mesa, wherein the two source regions that are separated from each other along the second lateral direction.

12. The power semiconductor device of claim 1, wherein the source region is contacted by at least one sidewall portion of an additional contact plug.

13. The power semiconductor device of claim 1, wherein the top width of the mesa amounts to no more than 500 nm.

14. A method of producing a power semiconductor device that includes, in a semiconductor body, a drift region of a first conductivity type, a plurality of trenches, wherein two adjacent trenches laterally confine a mesa of the semiconductor body, wherein each trench extends from a semiconductor body surface into the semiconductor body along a vertical direction and comprises a trench electrode isolated from the semiconductor body by a trench insulator, wherein each trench has a trench width along a first lateral direction and a trench length along a second lateral direction perpendicular to the first lateral direction, the trench length amounting to at least five times the trench width, and a semiconductor body region of a second conductivity type in the mesa, the method comprising:
forming a source region of the first conductivity type in the mesa, the source region being arranged above the semiconductor body region;
forming an insulation layer above and/or on the source region;
providing a mask, wherein the mask includes at least one mask bridge covering a first portion of the source region and at least one mask opening exposing second portions of the source region in the mesa and below the insulation layer, wherein the first portion of the source region separates two adjacent ones of second portions of the source region along the second lateral direction in the mesa;
in a region exposed by the at least one mask opening, removing a portion of the insulation layer and the second portions of the source region such that the remaining first portion of the source region forms an elevated source bridge between the two adjacent trenches in the mesa;
depositing an electrically conductive material for forming a contact plug that extends at least from an upper surface of the insulation layer along the vertical direction so as to contact the first portion of the source region at a sidewall portion thereof.

15. The method of claim 14, wherein the provided source region extends along an entire top width of the mesa in the first lateral direction.

16. The method of claim 14, wherein the contact between the contact plug and the first portion of the source region is established at an interface area at which the first portion of the source region interfaced with one of the second portions of the source region before the second portions of the source region have been removed.

17. The method of claim 16, wherein the interface area is tilted with respect to the second lateral direction.

18. The method of claim 14, wherein the at least one mask bridge bridges the entire mesa along the first lateral direction and/or has a total extension in the second lateral direction of no more than 500 nm.

19. The method of claim 14, wherein the formed contact plug has a total lateral extension in the second lateral direction corresponding to the total lateral extension of the at least one mask opening in the second lateral direction.

20. The method of claim 14, wherein the formed contact plug has a total lateral extension in the second lateral direction amounting to at least twice of the top width of the mesa and/or wherein the formed contact plug is in contact with both trench insulators of the adjacent trenches laterally confining the mesa.

21. The method of claim 14, wherein the removing step includes at least one selective etch processing step.

22. The method of claim 14, further comprising removing the mask before depositing the electrically conductive material for forming the contact plug.

23. The method of claim 14, further comprising, after removing, in the region exposed by the at least one mask opening, the portion of the insulation layer and the second portions of the source region, forming, in the remaining semiconductor body region, a semiconductor body contact region of a higher dopant concentration.

24. The method of claim 14, wherein the at least one mask bridge and the at least one mask opening extend perpendicular to the trench length in the second lateral direction.

\* \* \* \* \*